US011888586B2

(12) United States Patent
Raymond

(10) Patent No.: US 11,888,586 B2
(45) Date of Patent: Jan. 30, 2024

(54) LOW LATENCY NETWORK DEVICE AND METHOD FOR TREATING RECEIVED SERIAL DATA

(71) Applicant: Orthogone Technologies Inc., Ville Saint-Laurent (CA)

(72) Inventor: Alexandre Raymond, Blainville (CA)

(*) Notice: Subject to any disclaimer, the term of this patent is extended or adjusted under 35 U.S.C. 154(b) by 21 days.

(21) Appl. No.: 17/841,234

(22) Filed: Jun. 15, 2022

(65) Prior Publication Data
US 2023/0044462 A1 Feb. 9, 2023

Related U.S. Application Data

(60) Provisional application No. 63/203,541, filed on Jul. 27, 2021.

(51) Int. Cl.
*H04J 3/06* (2006.01)
*H04L 5/24* (2006.01)

(52) U.S. Cl.
CPC ............ *H04J 3/0664* (2013.01); *H04J 3/067* (2013.01); *H04L 5/24* (2013.01)

(58) Field of Classification Search
CPC ........ H04J 3/0664; H04J 3/067; H04J 3/0697; H04L 5/24; H03M 9/00
See application file for complete search history.

(56) References Cited

U.S. PATENT DOCUMENTS 7,830,986 B1 * 11/2010 Gaither ................. H03L 7/1075
327/147
7,913,104 B1 * 3/2011 Cory ......................... G06F 1/10
713/400

(Continued)

FOREIGN PATENT DOCUMENTS

| WO | 2016172765 A1 | 11/2016 |
| WO | 2018071961 A1 | 4/2018 |
| WO | 2020251810 A1 | 12/2020 |

OTHER PUBLICATIONS

"69011—UltraScale+ GTY Transceiver: TX and RX Latency Values," Solutions (https://www.xilinx.com/applications.html), Sep. 23, 2021, 5 pages.

*Primary Examiner* — Jae Y Lee
(74) *Attorney, Agent, or Firm* — Conley Rose, P.C.; Jonathan K. Polk

(57) ABSTRACT

A low-latency network device and method for treating serial data comprising an oscillator generating a device-wide clock; a receiving physical medium attachment (PMA) having an internal data width, a symbol timing synchronization module configured to receive the parallelized sample stream; and detect therefrom synchronized bit values corresponding to bit values of the received serial data; and a physical convergence sublayer (PCS). The PMA is configured to receive the serial data, deserialize the serial data based on the device-wide clock and internal data width, whereby the received serial data is oversampled, the oversampling of the received serial data being asynchronous relative to a timing of the received serial data, and output a parallelized sample stream. The PCS is configured to receive the synchronized bit values; and delineate packets therefrom to provide packet-delineated parallelized data. The PMA, the symbol timing synchronization module and the PCS are all driven by the device-wide clock.

20 Claims, 13 Drawing Sheets

(56) References Cited

U.S. PATENT DOCUMENTS

| | | |
|---|---|---|
| 9,772,649 B1* | 9/2017 | Mendel ............... G06F 13/4072 |
| 10,547,317 B1 | 1/2020 | Novellini et al. |
| 10,797,984 B1 | 10/2020 | Sardaryan et al. |
| 2018/0088622 A1* | 3/2018 | Leong ....................... G06F 5/06 |
| 2019/0020466 A1* | 1/2019 | Raymond .............. H04B 10/40 |
| 2020/0244595 A1 | 7/2020 | Snowdon et al. |
| 2020/0314021 A1 | 10/2020 | Dejanovic |

* cited by examiner

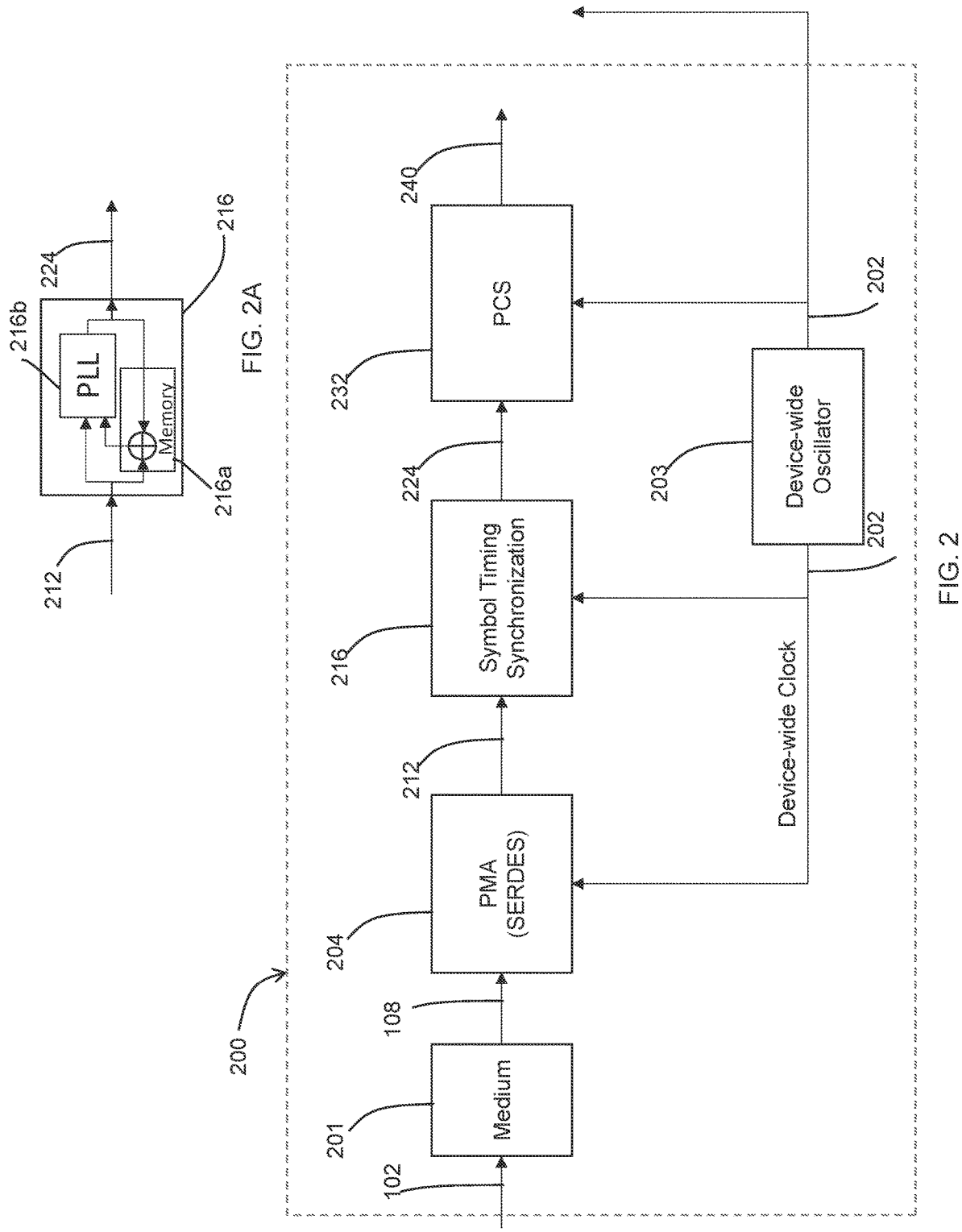

LOW LATENCY NETWORK DEVICE AND METHOD FOR TREATING RECEIVED SERIAL DATA

TECHNICAL FIELD

The present disclosure generally relates to a network device and method for receiving of serial data, and more particularly to the treatment of the received data to reduce latency.

BACKGROUND

Various network applications are latency-sensitive, in that it is desirable to achieve lower latency when carrying out the application. To decrease latency, various solutions dispense with features and functions of a typical Open Systems Interconnection (OSI)-based network stacks.

For example, a typical Ethernet switch will operate independent circuits for the receive-side physical medium attachment (PMA), receive-side physical convergence sub-layer (PCS), receive-side media access controller (MAC), transmit-side media access controller (MAC), transmit-side physical convergence sub-layer (PCS) and transmit-side physical medium attachment (PMA). Memory buffers are provided between the receive-side MAC and the transmit-side MAC to transact packets between the receive-side and the transmit-side.

To achieve lower latency, some network devices, in the context multiplexing switching applications, include discarding idle code blocks and buffering the data and packet start/termination blocks. Since the operations occur at a layer in between the physical layer (layer 1) and the data link layer (layer 2), such devices are typically called 1.5 layer devices.

There is a need to further improve the treatment of serial data at the ingress of network devices.

SUMMARY

According to one aspect, there is provided a low-latency network device for treating serial data received at a receiving data rate. The device includes an oscillator generating a device-wide clock; a receiving physical medium attachment (PMA) having an internal data width; a symbol timing synchronization module; and a physical convergence sublayer (PCS).
The PMA is configured to receive the serial data, deserialize the serial data based on the device-wide clock and internal data width, whereby the received serial data is oversampled, the oversampling of the received serial data being asynchronous relative to a timing of the received serial data, and output a parallelized sample stream. The symbol timing synchronization module is configured to receive the parallelized sample stream; and detect, from the parallelized sample stream, synchronized bit values corresponding to bit values of the received serial data. The physical convergence sublayer (PCS) is configured to receive the synchronized bit values; and delineate packets from the synchronized bit values, to provide packet-delineated parallelized data.
The receiving PMA, the symbol timing synchronization module and the PCS are being all driven by the device-wide clock.

In an embodiment, an operation is performed on the packet-delineated parallelized data externally of the network device. The operation is driven by the device-wide clock of the network device.

In an embodiment, the network device further comprises at least one packet-wise module configured to receive the packet-delineated parallelized data and to perform on the packet-delineated parallelized data at least one of: processing the packet-delineated parallelized data; logging the packet-delineated parallelized data; converting the packet-delineated parallelized data to a different medium; and broadcasting the packet-delineated parallelized data. The at least one packet-wise module is driven by the device-wide clock.

In an embodiment, the at least one packet-wise module comprises a transmitting physical medium attachment (PMA) configured to serialize a transmitting data stream generated from the packet-delineated parallelized data to output serialized transmitted data, the transmitting PMA being driven by the device-wide clock.

In an embodiment, the network device receives a plurality of serial data streams each comprising serial data. The network device comprises a plurality of receiving physical medium attachments each configured to deserialize and oversample a respective one of the plurality of serial data streams to output a respective parallelized sample stream, each of the receiving physical medium attachments being driven by the device-wide clock.

In an embodiment, the device-wide clock driving the receiving PMA and the device-wide clock driving the at least one packet-wise module is a same single device-wide clock.

In an embodiment, the parallelized sample stream from the receiving PMA is passed to the at least one packet-wise module as packet-delineated parallelized data free of a clock-domain crossing.

In an embodiment, the receiving PMA has an internal clock and data recovery (CDR) module and wherein the CDR module is disabled.

In an embodiment, the receiving PMA is driven by the device-wide clock free of a phase adjustment being applied to the device-wide clock.

In an embodiment, the symbol timing synchronization module implements a digital phase lock loop (PLL) to determine timing information for detecting the synchronized bit values from the parallelized sampled stream.

In an embodiment, the symbol timing synchronization module tracks, with the digital phase lock loop (PLL), frequency offsets in bit transitions between current and previous word(s) of the parallelized sampled stream.

In an embodiment, the network device is implemented in a field-programmable gate array (FPGA) with a programmable transceiver.

In an embodiment, the device-wide clock generated by the oscillator of the programmable transceiver is set at up to a maximum operable frequency of the internal oscillator.

In an embodiment, the symbol timing synchronization module is implemented on a fabric of the FPGA.

In an embodiment, the parallelized sample stream is an oversampling of the received serial data by a factor of at least 2.

In an embodiment, the parallelized sample stream is an oversampling of the received serial data by an integer factor n.

In an embodiment, the integer factor n equal 3.

In an embodiment, the received serial data is transmitted using multi-level encoding/modulation and wherein the parallelized sample stream is an oversampling of the multi-level received serial data by a factor of at least 1.3.

In an embodiment, the receiving data rate of the received serial data is 10.3125 Gb/s and the received serial data has 66b encoding.

In an embodiment, the internal data width of the receiving PMA is set at 64-bits wide.

In an embodiment, the network device further comprises a bit timestamping module configured to receive the synchronized bit values and to assign a bit-wise time stamp to each individual bit value.

In an embodiment, the bit timestamping module comprises a timestamp memory to log bit-wise time stamp to each individual bit value.

In an embodiment, the bit-wise time stamp assigned to each individual bit is assigned based on a time value, according to the device-wide clock, of the deserializing of the received serial data by the receiving PMA, the internal data width, and a position of a sample within the parallelized sampled stream corresponding to the individual bit.

According to another aspect, there is provided a method for processing serial data received at a receiving data rate. The method includes deserializing the received serial data, through a receiving physical medium attachment (PMA), to output a parallelized sample stream, the deserializing being driven by a device-wide clock generated by an oscillator, and according to a word-width of the parallelized sample stream, whereby the parallelized sample stream is an oversampling of the received serial data, the oversampling of the received serial data being asynchronous relative to a timing of the received serial data; detecting, through a symbol timing synchronization module, from the parallelized sample stream, synchronized bit values corresponding to bit values of the received serial data; and delineating packet on the synchronized bit values, through a physical convergence sublayer (PCS), to provide packet-delineated parallelized data. The receiving PMA, the symbol timing synchronization module and the PCS being all driven by the device-wide clock.

In an embodiment, the method further comprises executing, on the packet-delineated parallelized data, at least one of: processing the packet-delineated parallelized data; logging the packet-delineated parallelized data; converting the packet-delineated parallelized data to a different medium; broadcasting the packet-delineated parallelized data; and serializing a transmitting data stream generated from the packet-delineated parallelized data to output serialized transmitted data; while being driven by the device-wide clock.

In an embodiment, the at least one operation on the packet-delineated parallelized data comprises serializing a transmitting data stream generated from the packet-delineated parallelized data to output serialized transmitted data, the serializing being driven by the device-wide clock.

In an embodiment, a plurality of serial data streams are received. The method comprises deserializing each of the plurality of serial data streams to output a respective parallelized sample stream, each of the deserializing being driven by the device-wide clock.

In an embodiment, the device-wide clock driving the deserializing of the received serial data and the device-wide clock driving the at least one operation on the packet-delineated parallelized data is a same single device-wide clock.

In an embodiment, the parallelized sample stream is passed to the at least one operation performed on the packet-delineated parallelized data free of a clock-domain crossing.

In an embodiment, the deserializing of the received serial data is carried out free of recovering an internal clock signal from the received serial data.

In an embodiment, the deserializing is driven by the device-wide clock free of a phase adjustment being applied to the device-wide clock.

In an embodiment, detecting, through the symbol timing synchronization module, synchronized bit values from the parallelized sample stream, the symbol timing synchronization being carried out using a digital phase lock loop to determine timing information for detecting the synchronized bits values from the parallelized sampled stream.

In an embodiment, determining the timing information comprises tracking, with the digital phase lock loop (PLL), frequency offsets in bit transitions between current and previous word(s) of the parallelized sampled stream.

In an embodiment, the parallelized sample stream is an oversampling of the received serial data by a factor of at least 2.

In an embodiment, the parallelized sample stream is an oversampling of the received serial data by an integer factor n.

In an embodiment, detecting, through the symbol timing synchronization module, synchronized bit values from the parallelized sample stream, consist of selecting one sample out of n samples received from the parallelized sample stream.

In an embodiment, the integer factor n equal 3.

In an embodiment, the received serial data is transmitted using multi-level encoding/modulation and wherein the parallelized sample stream is an oversampling of the multi-level received serial data by a factor of at least 1.3.

In an embodiment, the receiving data rate of the received serial data is 10.3125 Gb/s and the received serial data has 66b encoding.

In an embodiment, the word-width of the parallelized sample stream is 64-bits wide.

In an embodiment, the delineating packet on the synchronized bit values comprises at least one of carry out frame synchronization, descrambling, and block code detection.

In an embodiment, the method further comprises assigning a bit-wise time stamp to each individual bit value of the synchronized bit values.

In an embodiment, the bit-wise time stamp assigned to each individual bit is assigned based on a time value, according to the device-wide clock, of the deserializing of the received serial data, the word-width, and a position of a sample within the parallelized sampled stream corresponding to the individual bit.

BRIEF DESCRIPTION OF THE DRAWINGS

For a better understanding of the embodiments described herein and to show more clearly how they may be carried into effect, reference will now be made, by way of example only, to the accompanying drawings which show at least one exemplary embodiment, and in which:

FIG. 2 illustrates a schematic diagram of a network device according to one example embodiment;

FIG. 2A illustrates a more detailed diagram of a symbol timing synchronization module according to one example embodiment;

Figure 1:
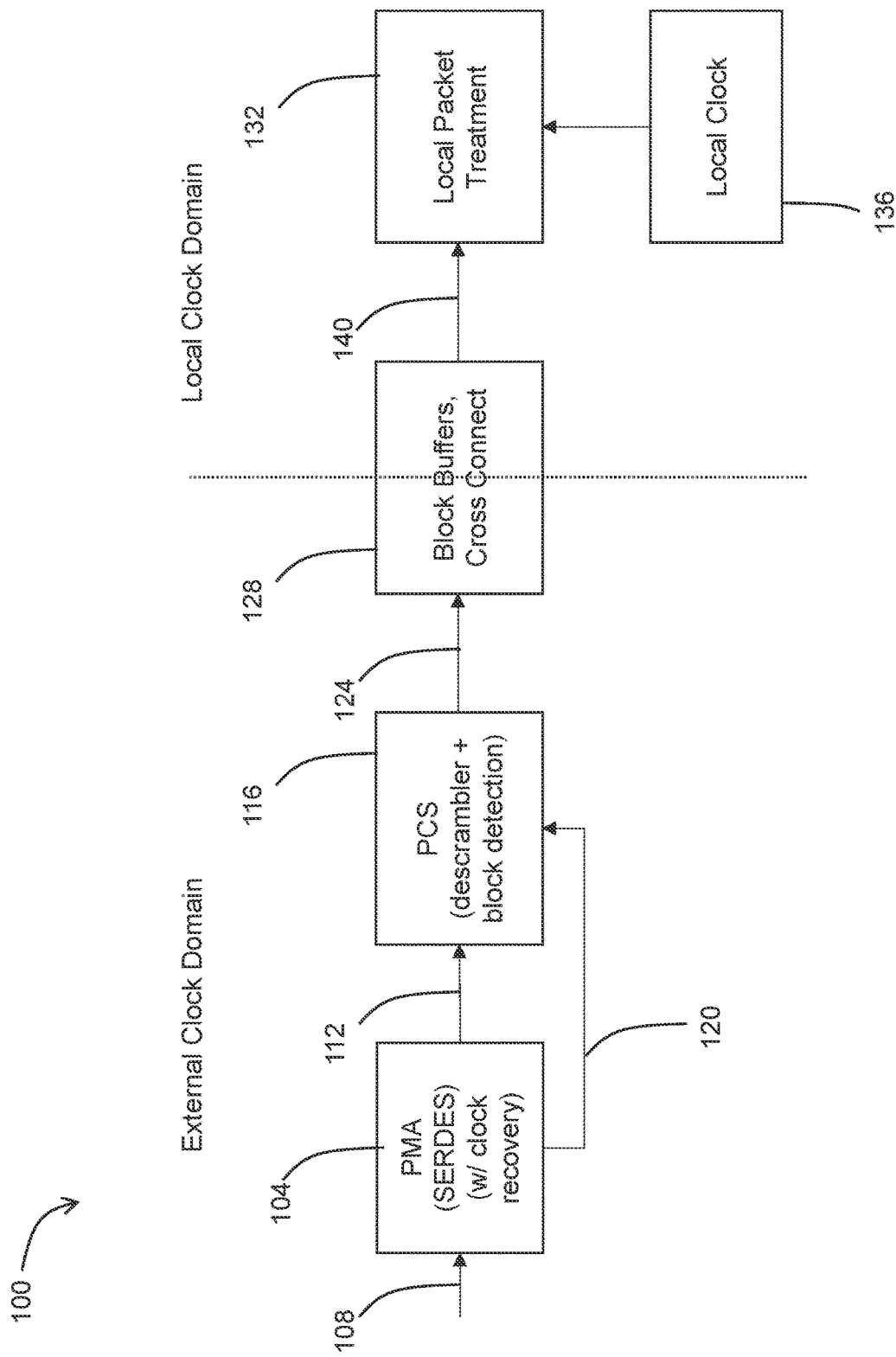
FIG. 1 illustrates a schematic diagram of the modules of a receiver portion of a representative prior art network device.

It will be appreciated that for simplicity and clarity of illustration, elements shown in the figures have not necessarily been drawn to scale. For example, the dimensions of some of the elements may be exaggerated relative to other elements for clarity.

DETAILED DESCRIPTION

It will be appreciated that, for simplicity and clarity of illustration, where considered appropriate, reference numerals may be repeated among the figures to indicate corresponding or analogous elements or steps. In addition, numerous specific details are set forth in order to provide a thorough understanding of the exemplary embodiments described herein. However, it will be understood by those of ordinary skill in the art, that the embodiments described herein may be practiced without these specific details. In other instances, well-known methods, procedures and components have not been described in detail so as not to obscure the embodiments described herein. Furthermore, this description is not to be considered as limiting the scope of the embodiments described herein in any way but rather as merely describing the implementation of the various embodiments described herein.

In this specification, a network device refers to a component of a network that implements one or more protocol layers. Examples of network devices include switches, such as Ethernet switches, and network interface controller (NIC). The term "module" encompasses portions or sections of integrated circuits, such as FPGAs and ASICs, that implement logic functions. Modules can comprise programmable interconnects elements, input/output block (IOB), configurable logic blocks (CLBs), including transistors and/or look-up tables (LUTs), multiplexers and flip-flops, or dedicated hard-silicon blocks, including different programmable tiles such as memory, controllers, processors, digital clocks, PLLs and/or serializers and deserializers.

Broadly described, various embodiments herein provide for treatment of serial data received within a communications network. The serial data is typically received after having been transmitted over a physical communication link, such as an optical link, copper twin-axial cabling, etc. After being received and having appropriate physical treatment of the received signals applied thereto, such as filtering and medium conversion, the received serial data is further treated at a receiving end of the network device so as to ready the data for further operations to be performed thereon, such as switching, processing, logging, medium conversion, or broadcasting. Various embodiments described herein provide low latency treatment of the received serial data when readying the data for further operations.

Referring now to FIG. 1, therein illustrated is a schematic diagram of the modules of a receiver portion of a representative prior art networking device 100. The prior art networking device 100 includes a PMA module 104 that receives serial digital data 108. The networking device also includes components for treating and/or converting the received physical signals carrying the data over the physical communication link (ex: optical cable, copper twin-axial cabling) to produce (ex: optical-to-electrical conversion, signal amplification, etc.) the received serial data 108 that is processed by the PMA module 104. Such components are not shown in FIG. 1.

The PMA module 104 includes a serializer/deserializer (SERDES). When operating as a receiver, the PMA module 104 deserializes the received serial data 108. The deserializing includes a clock data recovery step (CDR) to recover timing information of the received serial data 108. This recovered timing information (i.e. a recovered clock) is used for synchronization, which is further used by the PMA module 104 to determine the bit values within the received serial data 108. The PMA module 104 typically has an internal CDR submodule to recover the timing information. The PMA module 104 outputs the detected bit values as a parallelized bit value stream 112.

The prior art networking device 100 further includes a PCS module 116. The PCS module 116 is configured to receive the parallelized bit value stream 112 and to provide packet delineation of the parallelized bit value stream 112 (i.e. to determine the data packets contained within the serial digital data 108). The PCS module 116 can carry out frame synchronization, descrambling and block code detection (ex: idle, start, data, term, ordered codes) as part of the packet delineation. The PCS module 116 has the same timing as the PMA module 104 and is driven by the clock signal 120 recovered by the internal CDR of the PMA module 104. The PCS module 116 outputs packet-delineated data 124 that is also timed (i.e. synchronized) to the recovered clock signal 120.

The prior art networking device 100 further includes a block buffering and cross-connect module 128 that receives and temporarily stores the packet-delineated data 124 outputted by the PCS module 116. The block buffering and cross-connect module 128 can include a first-in-first-out (FIFO) buffer for storing the packet-delineated data 124.

The packet-delineated data 124 stored in the block buffering and cross-connect module 128 is made available for use by at least one other component of the networking device 100. In FIG. 1, the at least one other component of the networking device 100 is notionally represented by a local packet treatment module 132. For example, the local packet treatment module 132 can include the transmit-side PCS and transmit-side PMA, as described in the background section, to complete switching of the received data.

The local packet treatment module 132 is driven by a local clock/oscillator 136. The local clock/oscillator 136 can be internal to the networking device 100 or can be provided by other components downstream of the local packet treatment module 132. The local clock/oscillator 136 is independent of, and unsynchronized with, the clock signal 120 recovered from the received serialized data 104 by the PMA module 104. The local clock/oscillator 136 and the clock signal 120 can also have different speeds (i.e. frequencies). This is because the received serialized data 104 is received from another transmitting device that has its own timing (i.e. regarding when the transitions between each data bit of the receive serial data 108 occur) that is independent of the timing of the local packet treatment module 132 of the network device 100 being driven by the local clock 136. Accordingly, when the local packet treatment module 132 retrieves the data stored in the block buffer and cross-connect module 128, that data is synced to the local clock/oscillator 136, and is identified in FIG. 1 as resynced packet-delineated data 140.

It was observed that the recovered clock signal 120 drives the PMA module 104 and the PCS module 116 on one side of the block buffer and cross connect module 128 and the local clock 136 drives the at least one local packet treatment module 132 on the other side of the block buffer and cross connect module 132. The use of two different clocks (120, 136) causes the PMA module 104 and the PCS module 116 to operate in a first clock domain (denoted as the External Clock Domain in FIG. 1) and the local packet treatment module 132 to operate in a second clock domain (denoted as the Local Clock Domain in FIG. 1).

The block buffer and cross connect module 128 bridges the external clock domain and the local clock domain, thereby providing a clock domain crossing. Packet-delineated data 124 is retimed to resynced packet-delineated data 140. It was observed that the clock domain crossing is a source of latency that amounts to at least one or two clock cycles (of the destination, local clock).

Referring now to FIG. 2, therein illustrated is a diagram of the modules of a receiver portion of an improved low latency network device 200, according to one exemplary embodiment. The low latency network device 200 includes an oscillator 203, which can also be referred to as a device-wide oscillator, that generates a device-wide clock 202, which directly drives various components of the low latency network device 200, including the receiving-side PMA 204, the symbol timing synchronization module 216 and the receiving-side PCS 232.

The low latency network device 200 includes a PMA 204 that receives serial data 108 at a receiving data rate. The PMA (Physical Medium Attachment) can be a hard block in a physical layer (PHY) of a FPGA. In a possible embodiment, this module can exist alongside the programmable fabric of the FPGA. The receiving data rate, as used herein, refers to the rate at which bit values of the serial data 108 is delivered. The low latency network 200 also includes a medium 201, composed of components for treating and/or converting the received physical signals carrying the data over the physical communication link 102 (ex: optical cable, copper twin-axial cabling) to produce (ex: optical-to-electrical conversion, signal amplification, etc.) the serial digital data 108 that is processed by the PMA module 204. The medium 201 can include a differential receiver input, a fixed gain and/or an automatic gain control (AGC), an equalizer, a serializer/deserializer (SERDES), or any combination thereof. The medium 201 is generally part of the PMA, but it is understood that the medium may be external to the PMA and also external to the physical layer (PHY) of a FPGA.

The PMA 204 includes a serializer/deserializer (SERDES). In the embodiment described, the SERDES is embedded in the PMA module or block, and part of the physical layer of the FPGA, but other configurations are possible. When operating as a receiver, the receiving PMA 204 deserializes the serial data using the device-wide clock 202, thereby oversampling the received serial data to output a parallelized sample stream 212. The PMA comprises the logics components able to convert the serial data into a parallel data stream, including for example buffers, shift registers, PLL, output latch, etc. The receiving PMA 204 is driven by the device-wide clock 202, and does not use the timing information of the received data. In other words, the PMA does not recover the clock or timing information from the serial data 108. The PMA 204 has a given internal data width (64-bits for example), which defines the number of units (also referred to herein as the number of "samples") in each set of parallel units outputted by the deserializer of the PMA module 204. It is understood that the data width may be limited to predetermined available width of the FPGA fabric interface. An internal data width of 64-bits is a possible data width, but a PMA having other data width can be used, depending for example on the encoding of the serial data. Each set of parallel units outputted by the deserializer is also referred to herein as a "word" and the internal data width is also referred to herein as the "word width". In possible embodiments, the PMA can output words of 64 bits each. For each cycle of the device-wide clock 202, the deserializer of the PMA module 204 generates one word having a number of parallel units or samples corresponding to the internal data width (64-bits for example).

In some implementations, the device-wide clock 202 corresponds to the network device's local transmitter reference clock, which may also be used for transmitting the data. FPGAs can contain analog phase-locked loop and/or delay-locked loop components to synthesize new clock frequencies and attenuate jitter. The device wide clock can be generated locally by an oscillator 203, part of the FPGA, and configured to generate a device-wide clock 202 at a predetermined frequency, independently from the internal clock of the CDR.

The speed (i.e. frequency) of the device-wide clock 202 is selected and the PMA module 204 is configured to have the given internal data width. The combination of the internal data width and device-wide clock frequency causes the deserializer to oversample the received serial data 108. The length in time of each data bit of the received serial data 108 is equal to the inverse of the receiving data rate. Each data bit of the received serial data 108 is also herein referred to as a "symbol" of the received serial data 108. The sampling rate of the deserializer of the PMA module 204 is equal to the product of i) the speed of the device-wide clock 202 and ii) the internal data width. The duration of each sample, also referred to herein as an "unit interval", is equal to the inverse of the sampling rate. The ratio of the sampling rate to the receiving data rate defines the oversampling factor, which also corresponds to the average number of parallel units outputted by the deserializer per data bit of the received serial data 108. Accordingly, the PMA module 204 outputs a parallelized sample stream 212 that is an oversampling of the received serial data.

For example, where the received serial data 108 has a receiving data rate of 10.3125 Gb/s, each data bit or symbol of the received serial data 108 has a duration in time of 1/10.3125 Gb/s=96.97 ps. For example, where the device-wide clock 202 is configured to have a speed of 483.398 MHz and the deserializer is configured to have a 64-unit internal data width, the PMA module 204 operates with a sampling rate of 483.398 MHz×64-bits=30.9375 Gb/s. In this case, each unit or sample of the parallelized sample stream 212 has a unit interval of 1/30.9375 Gb/s=32.32 ps. The oversampling factor in this example is 3 (the sampling rate is 3 times the receiving data rate, the duration of each data bit/symbol of the received serial data is 3 times the unit interval).

The oversampling factor is selected so that there are sufficient samples for each data bit/symbol of the received serial data 108 to permit recovery and synchronization of the values of data bit/symbols of the received serial data 108 from the oversampling parallelized sample stream 212. Where the received serial data 108 is transmitted in binary format (for example, encoded using a non-return to zero (NRZ) encoding), the oversampling factor can be at least a factor of 2. The oversampling factor can also be an integer factor, so as to minimize jitter in the oversampling parallelized sample stream 212 and gain certainty. The oversampling factor is a compromise between a maximum number of samplings to determine precisely the value of each symbol and a realistic number to keep the system as fast as possible. According to one example embodiment, the oversampling factor is 3. In other embodiments, the oversampling factor can also be a non-integer factor, such as 2.5, as an example only.

The oversampling of the received serial data 108 by the PMA module 204 is asynchronous. The received serial data 108 has its own timing, i.e. regarding when the transitions between each data bit/symbol of the received serial data 108 occur, which depends on the device that transmitted the data 108 to the network device and on any phase shifts introduced over the transmission link over which the data 108 traveled. No attempt is made within the PMA module 204 to recover the timing of the received serial data 108. More particularly, no clock data recovery step is performed to recover the timing information of the received serial data 108. The internal CDR submodule of PMA module 104 is disabled or bypassed. The PMA module 204 can further be set to a lock-to-reference mode, wherein the reference is the device-wide clock 202. Since no attempt is made within the PMA module 204, the timing of the device-wide clock 202 is not synchronized to the timing of the received serial data 108, hence the oversampling being asynchronous relative to a timing (i.e. bit transitions) of the received serial data.

According to various example embodiments, no recovery of the timing of the received serial data 108 is performed within the low latency network device 200 downstream of the PMA module 204 so as to cause synchronization of the device-wide clock 202 with the timing of the received serial data 108. As illustrated in FIG. 2, the clock signal from the device-wide clock 202 is used to directly drive the PMA module 204, to cause asynchronous oversampling of the received serial data 108. Accordingly, the PMA module 204 is driven by the device-wide clock free of (i.e. without) a phase adjustment, such as a phase lock loop, being applied to the clock signal from the device-wide clock 202. This configuration is particularly efficient as there is no processing performed on the device-wide clock, thus no additional components needed.

Continuing with FIG. 2, the low latency network device 200 also includes a symbol timing synchronization module 216 that receives the parallelized sample stream 212. At this stage, the parallelized sample stream 212 contains a stream of parallel words, each word having a number of samples according to the selected internal data width of the deserializer of the PMA module 204. These samples are an asynchronous oversampling of the received serial data 108 by the oversampling factor. The symbol timing synchronization module 216 is configured to detect, from the parallelized sample stream 212, synchronized bit values corresponding to values of the data bits/symbols of the received serial data 108. Due to the oversampling, for each data bit/symbol of the received serial data 108, there are multiple samples of that data bit/symbol within the stream of parallel words. This multiple of samples (in parallelized sample stream 212) to symbols (in the received serial data 108) averages out to be approximately equal to the oversampling factor, attributing any difference to a frequency offset between the device-wide clock and the far-end transmitter.

Figure 3:
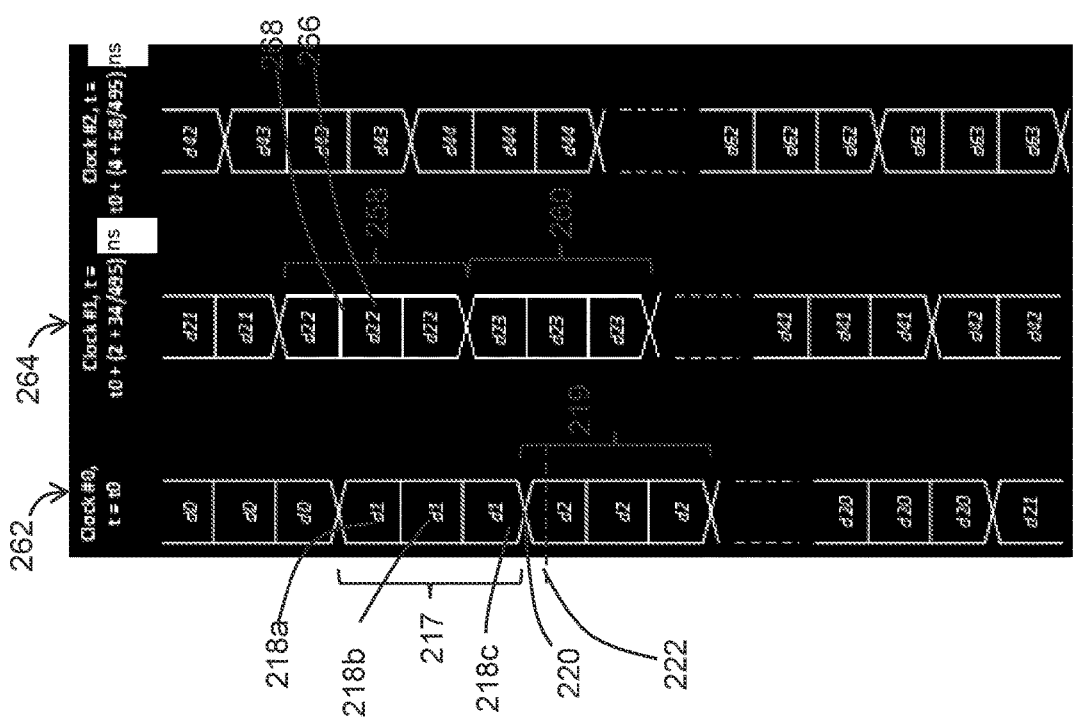
FIG. 3 illustrates a representation of three 64-bit/sample words of an exemplary parallelized sample stream.

FIG. 3 illustrates a representation of three 64-bit/sample words of an example parallelized sample stream 212 that is an oversampling of 64 data bits/symbols of the received serial data 108 (symbols "d0" to "d63"). In this example, the oversampling factor is 3X so that there are 3 samples in the parallelized sample stream 212 per data bit/symbol of the received serial data 108. For example, for data bit value/symbol 217 ("d1"), there are three samples 218*a*, 218*b*, 218*c*. Because the oversampling of the received serial data 108 is asynchronous, the transitions between each two adjacent subsets of samples within the parallelized sample stream 212 (corresponding to two adjacent data bits/symbols of the received serial data 108, identified by reference numerals 217 and 219 in FIG. 2) are not aligned in time with the actual transitions of the corresponding two adjacent subset data bit values/symbols. In the example of FIG. 3, the samples of the parallelized sample stream 212 indicate a transition between symbols "d1" (217) and "d2" (219) of the received serial data 108 as occurring at the transition between the last sample of "d1" and the first sample of "d2", as denoted by the sample transition 220. However, in the example, the sampling is slightly ahead in time such that this transition 220 is ahead of the actual transition between symbols "d1" and "d2" of the received serial data 108, as denoted by line 222.

The oversampling factor is selected so that there are sufficient samples within parallelized sample stream 212 for each corresponding data bit value/symbol of the received serial data 108 so that symbol timing synchronization module 216 can accurately predict or detect transitions between adjacent data bits/symbols of the received serial data 108. Based on the predicted or detected transitions between adjacent data bits/symbols of the received serial data 108, the symbol timing synchronization module 216 further selects, for each data bit/symbol, the appropriate sample from the parallelized sample stream 212 to represent that data bit/symbol.

As shown in detail in FIG. 2A, the prediction of the transitions between adjacent data bit values/symbols for a current word (i.e. one set of samples of the internal data width) of the parallelized sample stream 212 can be carried out by tracking one or more of the transitions between samples in at least one recent previous word of the parallelized sample stream 212 stored in a memory 216*a*, such as a buffer. Long-term observation of frequency offsets (i.e. continual phase increment/decrement) may also be used to predict transitions, and these offsets can be stored in the memory 216*a*. According to one example embodiment, a first order phase lock loop 216*b* that considers only the transitions between samples of the parallelized sample stream 212 in the current word and most recent previous word or words can be used to determine the transitions between adjacent data bits/symbol of the current word. Alternatively, a higher order phase lock loop 216b can be implemented, but at the cost of higher complexity and perhaps higher latency. The prediction of transitions between adjacent data bits/symbols can be carried out according to other symbol timing synchronization techniques, however a first order PLL provides the advantage of limiting latency in tracking transitions.

The symbol timing synchronization module 216 is further configured to detect and select, based on the predicted transitions between adjacent data bits/symbols for the current word, the appropriate sample of the parallelized sample stream 212 to represent each corresponding data bit/symbol of the received serial data 108. This selection corresponds to finding the center sample of each subset of samples that correspond to a data bit value/symbol of the received serial data 108. The bit values of the selected samples form the synchronized bit values corresponding to the values of data bits/symbols of the received serial data 108. The symbol timing synchronization module 216 outputs the synchronized bit values 224.

Figure 4:
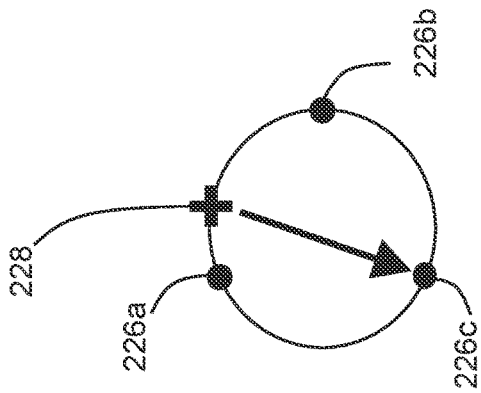
FIG. 4 illustrates a representation of sample phases on a unit circle and the selection of a center sample based on a predicted transition between symbols according to one example embodiment having an oversampling factor of 3.

FIG. 4 illustrates a representation of sampling phases on a unit circle according to one exemplary example having a 3X oversampling factor. For each data bit/symbol of the received serial data 108, there are 3 sample points 226a, 226b, 226c that are $2\pi/3$ radians apart from one another. Plus icon (+) 228 represents the predicted point of transition between two adjacent symbols as determined from previously received word(s) of the parallelized sample stream 212. In the illustrated example, plus icon (+) 228 is located between sample points 226a, 226b. Given the 3X oversampling factor and the 3 sample points per symbol, the center of each subset of 3 samples corresponding to each data bit/symbol will be located two samples away from the transition location denoted by plus icon (+) 228. Accordingly, the sample corresponding to sample point 226c is selected as the center sample and the value of that sample is selected as the synchronized bit value 224 corresponding to the data bit value/symbol of the received serial data 108. Note that the value selected for the oversampling factor (3) is exemplary, and other values n may be selected, depending on the applications for which the network device is to be used.

The symbol timing synchronization module 216 is also driven by the device-wide clock 202. As illustrated in FIG. 2, the clock signal from the device-wide clock 202 is used to directly drive the symbol timing synchronization module 216. Accordingly, the symbol timing synchronization module 216 is also driven by the device-wide clock 202 free of (i.e. without) any phase adjustments being applied to the clock signal from the device wide clock 202. It is appreciated that the symbol timing synchronization module 216 operates in an open loop, that is to say that neither the symbol timing synchronization module 216 itself nor the PLL that may be part of the symbol timing synchronization module 216 are receiving any feedback from downstream of the PCS module 232. In other words, the device-wide clock 202 driving the symbol timing synchronization module 216 is stable and none of a phase adjustment nor a frequency adjustment is applied to the device wide clock 202.

The stream of synchronized bit values 224 is similar to the parallelized bit values stream 112 of the representative prior art network device 100 illustrated in FIG. 1 in that both streams of bit values are a parallelized data stream of the received serial data 108. However, there is a key difference in that the parallelized bit values stream 112 of the prior art network device 100 is timed (i.e. synchronized) to the timing of the received serial data 108 due to the deserialization being carried out using the recovered clock signal 120. By contrast, the stream of synchronized bit values 224 in the improved low latency network device 200 is timed (i.e. synchronized) to the timing of the device-wide clock 202 because the oversampling of the received serial data 108 is carried out according to the device-wide clock 202. Furthermore, since the center samples from the parallelized sample stream 212 are selected by the symbol timing synchronization module 216 to form the synchronized bit values 224, the synchronized bit values 224 are also timed to the timing of the device-wide clock 202.

The synchronized bit values 224, which form part of a parallel stream of data, is received at a PCS module 232 of the low latency network device 200. The PCS module (Physical Coding Sublayer) can also be a hard block in a physical layer (PHY) of a FPGA. This module can exist alongside the programmable fabric of the FPGA. The PCS module 232 is configured to receive the synchronized bit values 224 and to perform packet delineation of the synchronized bit values 224 (i.e. to determine the data packets contained within the received serial data 108). The PCS can comprise the logics components, able to perform packet delineation. The PCS module 232 can carry out frame synchronization, descrambling and block code detection (ex: idle, start, data, term, ordered codes) as part of the packet delineation. Because the synchronized bit values 224 are timed to the device-wide clock 202, the PCS module 232 is also driven by the device-wide clock 202. The PCS module 232 outputs packet-delineated parallelized data 240.

As can be appreciated, while the packet-delineated parallelized data 240 of the prior art network device 100 is timed (i.e synchronized) to the timing of the received serial data 108, the PCS of network device 200 is clocked on the device-wide clock, which is also the clock used by the PMA, and preferably the same clock used for downstream operations, such as logging, switching, transmitting, etc. With the prior art network device 100, an operation that provides clock-domain crossing from the external clock domain to the local clock domain is required before operations can be carried out on the packet-delineated data 124 according to the timing of the local clock 136. In the example of FIG. 1, the prior art network device 100 uses the block buffer and cross connect module 128 to provide the clock domain crossing from the external clock domain to the local clock domain and to resync to the resynced packet-delineated data 140, a process that necessarily adds latency.

By contrast, the packet-delineated parallelized data 240 in the improved low latency network device 200 is already timed (i.e. synchronized) to the timing of the device-wide clock 202 because the oversampling of the received serial data 108 and also subsequent processing is carried out according to the device-wide clock 202. In other words, the receiving PMA, the symbol timing synchronization module and the PCS are all driven by the device-wide clock. Accordingly, operations can be carried out on the packet-delineated parallelized data 240 on a packet-wise basis using the timing of the device-wide clock 202 free of (i.e. without) a clock domain crossing being implemented. As described elsewhere, implementing the clock domain crossing would have introduced latency amounting to at least one or two clock cycles (of the destination clock, being the local clock 136). Accordingly, in being free of a clock-domain crossing, the reduction of the at least one or two clock cycles is achieved in the improved low-latency network device 200.

The packet-delineated parallelized data 240, being timed to the device-wide clock 202, can be received by at least one packet-wise module that performs one or more operations on the packet-delineated parallelized data 240 using the timing of device-wide clock 202 (i.e. being also driven by the device-wide clock 202). The at least one packet-wise module can be implemented as part of the improved low-latency network device 200. In some embodiment, the packet-wise module is a module that is configured to receive a packet-delineated parallelized data as an input, and can comprise, for example, configured logical blocks (CLBs), from an FPGA fabric, designed for a specific function, such as switching, logging, processing, medium conversion, or broadcasting, or else. Alternatively, the at least one packet-wise module can be external to the low-latency network device 200 and this external device receives the clock signal from the device-wide clock 202 so as to have the same timing.

The operation performed on the packet-delineated parallelized data 240 can include generating a transmitting data stream from the packet-delineated parallelized data 240, such as generating the transmitting data stream using a transmitter-side PCS module (not shown). The transmitting data stream can then be transmitted to another network device as part of switching the received serialized data 108.

The operation performed on the packet-delineated parallelized data 240 can include processing the packet-delineated parallelized data 240. The processing can include one or more of deep packet inspection, high frequency trading, data encryption, data decryption, decoding to audio/video/multimedia/gaming, network timing and synchronization, or other general use of the time or contents of the received packet data.

The operation performed on the packet-delineated parallelized data 240 can include logging data the packet-delineated parallelized data, such as in test and measurement equipment, event or alarm logging.

The operation performed on the packet-delineated parallelized data 240 can include converting the received serial data 108 to different media, such as internetworking for transport, storage, ethernet media at a different line rate, wireless networks, access networking protocols such as cellular data or passive optical networks.

The operation performed on the packet-delineated parallelized data 240 can include broadcasting or multicasting of the packet-delineated parallelized data 240 to several ports simultaneously or to over-the-air video, audio or data channels.

Figure 5A:
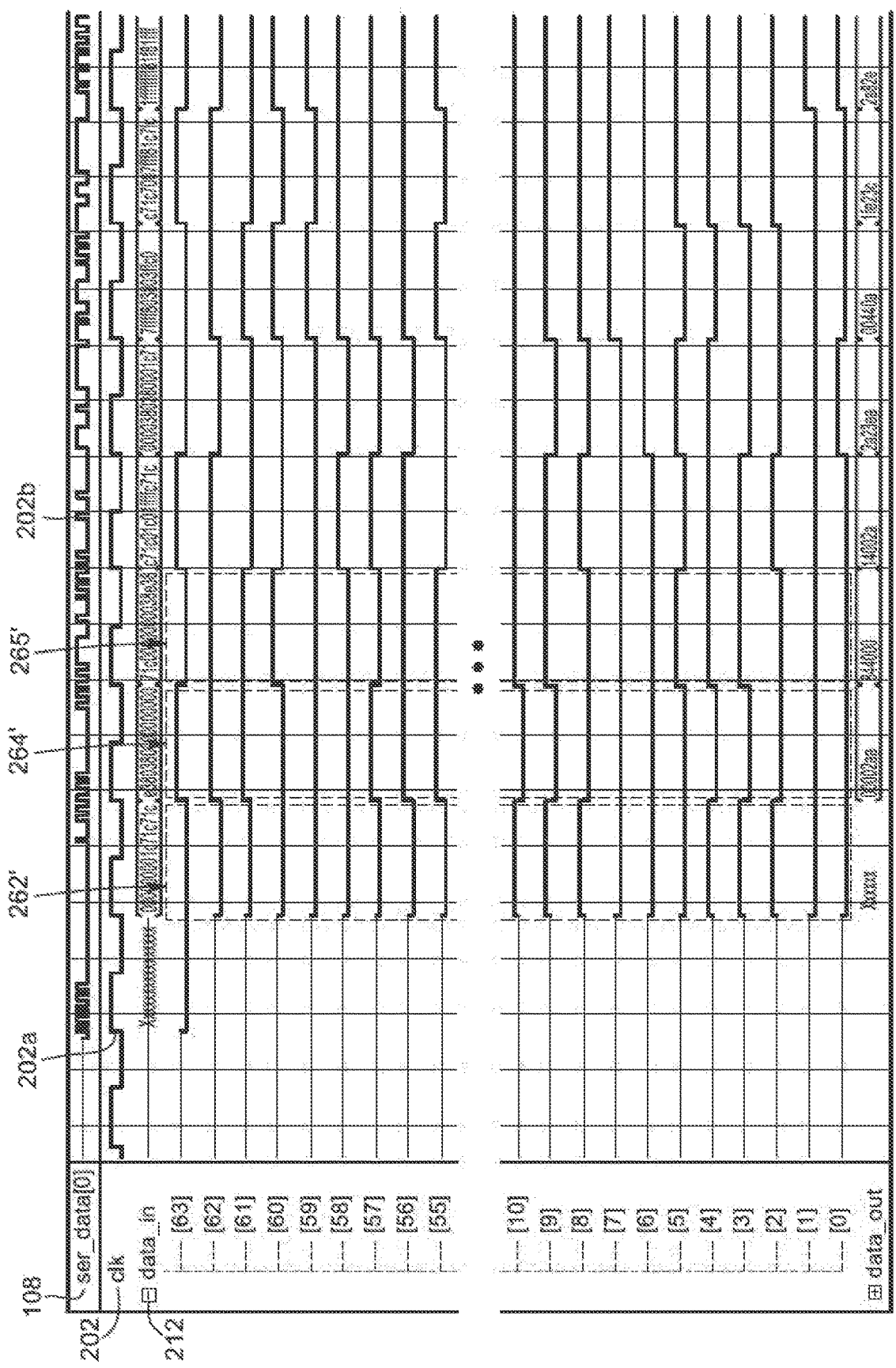
FIGS. 5A and 5B are a timing diagrams representing a bit stream through the different modules of FIG. 2, in accordance with an embodiment.
Figure 5B:
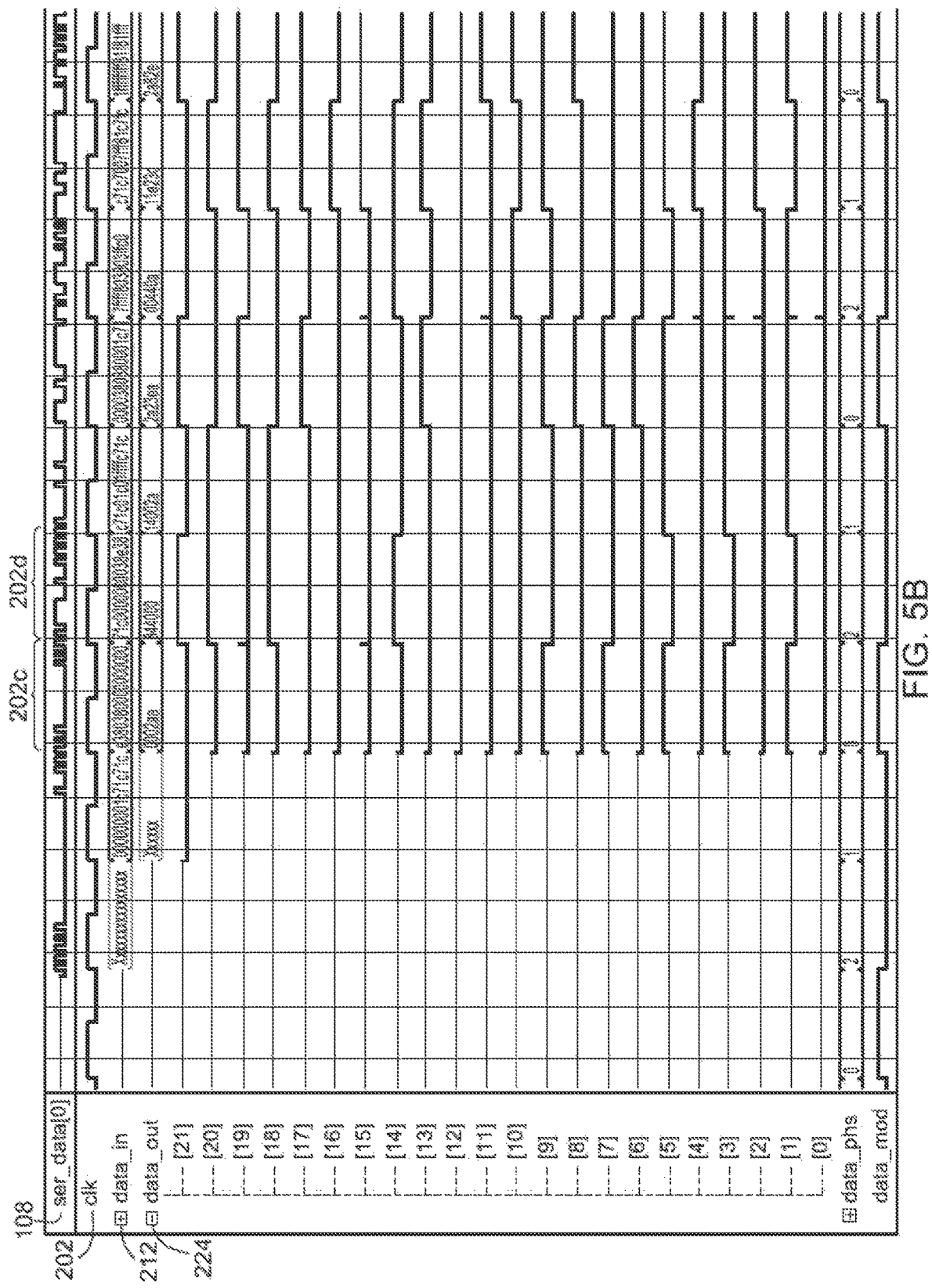

Referring now to FIGS. 5A and 5B, therein illustrated is an example of a bit stream within a low-latency network device. In FIG. 5A, the serial data (indicated as "ser_data[0]") 108 is received upstream of the PMA. In this example, the received serial data 108 comprises 64 values of data bit/symbols. These values are 0101010101000000000000[ . . . ]. The device-wide clock (indicated as "clk") 202 is provided by an internal oscillator of the network device. In this embodiment, the device-wide clock is configured to have a speed of 483.398 MHz and the PMA is configured with a 64-unit internal data width. The PMA module 204 operates with a sampling rate of 483.398 MHz×64-bits=30.9375 Gb/s. Therefore, since each data bit/symbol is oversampled 3 times, the parallelized sample stream 212 exiting the PMA is composed of 3 words (262', 264' and 265') of 64-bits, indicated by "data_in[63:0]". In other words, the parallelized sample stream 212 corresponding to the first received serial data 108 comprises (3×64) 192 samples, spread over 3 words.

On the first rising edge 202a of the device-wide clock 202, the 64-bits of first word 262' of the parallelized sample stream 212, data_in[63:0] have the following values:
bits[1:0] are "00" (the 2 remaining sample data of the first symbol 0),
bits[4:2] are "111" (the second symbol equal to 1),
bits[7:5] are "000" (the third symbol equal to 0),
bits[10:8] are "111" (the fourth symbol equal to 1),
bits[13:11] are "000" (the fifth symbol equal to 0),
bits[16:14] are "111" (the sixth symbol equal to 1),
bits[19:17] are "000" (the seventh symbol equal to 0),
bits[22:20] are "111" (the eighth symbol equal to 1),
bits[25:23] are "000" (the nineth symbol equal to 0),
bits[28:26] are "111" (the tenth symbol equal to 1),
and remaining bits [63:29] are all set to "0" representing the following 11 symbols of serial data 108 that are all equal to 0.

The advantageous aspect of symbol timing synchronization 216 for this application, is that instead of running the SERDES's clock-and-data recovery (CDR) loop of the PMA 204 to recover the received serial data 108, it is sampled at about the same frequency as the device-wide clock, which is also the same frequency through all modules (PMA, Symbol timing synchronization, PCS and even the packet-wise module). By doing so, when the symbol timing configuration is performed for example with a clock running at a 30.9375 GHz rate, a 2 to 4 clock cycle penalty is avoided (4.14 ns to 8.3 nsec)—which would otherwise be observed when a clock domain crossing is performed in a cross-domain crossing module (crossing from an external clock domain to a local clock domain), as observed in previous art. In the example of a 30.9375 GHz clock, each clock cycle has a duration in time of 1/(30.9375 GHz/64-bits)=2.07 ns. Therefore, two clock cycles have a duration in time of 4.14 ns and four clock cycles have a duration in time of 8.3 ns.

Still referring to FIG. 5A, the first word 262' of 64-bits of parallelized sample stream 212 enters the symbol timing synchronization module 216, which is configured to detect and select, from the parallelized sample stream 212 and based on the predicted transitions between adjacent data bits/symbols for the current word 262', the appropriate sample of the parallelized sample stream 212 to represent each corresponding data bit/symbol of the received serial data 108. This selection corresponds to finding a center sample of each subset of samples that correspond to a data bit value/symbol of the received serial data 108. While each word comprises 64-bits (which cannot be divided by 3), the center sample will not always be located at the same position within a word. The symbol timing synchronization module 216 will either select 21 or 22 bits per words to produce the synchronized bit values 224. Therefore, 3 phases output can be considered from the symbol timing synchronization module 216.

A first phase is sampling at bit 0 modulo 3, which mean that bits 0, 3, 6, 9, . . . , 63 of the parallelized sample stream 212 word are elected as the synchronized bit value for the corresponding data bit value/symbol of the received serial data 108. Such first phase produces a 22-bits synchronized bit values 224.

A second phase is sampling at bit 1 modulo 3, which mean that bits 1, 4, 7, 10, 13, . . . , 61 of the parallelized sample stream 212 word are elected as the synchronized bit value for the corresponding data bit value/symbol of the received serial data 108. Such second phase produces a 21-bits synchronized bit values 224.

A third phase is sampling at bit 2 modulo 3, which mean that bits 2, 5, 8, 11, 14, . . . , 62 of the parallelized sample stream 212 word are elected as the synchronized bit value for the corresponding data bit value/symbol of the received serial data 108. Such third phase produces a 21-bits synchronized bit values 224.

FIG. 5B shows a first phase, where synchronized bit values 224 comprise 22-bits (indicated as "data_out"), as an output from the symbol timing synchronization 216. Another signal, indicated as "data_mod" is also shown. The synchronized bit values 224 can be determined by combining the values of "data_out[21:0]" and "data_mod": when "data_mod" is 0, data_out[20:0] are valid (21 bits) and when "data_mod" is 1, data_out[21:0] are valid (22 bits). Such configuration signal "data_mod" can be stored in the memory 216a of the symbol timing synchronization module 216. On the first cycle of the device-wide clock 202c, data_out[21]='0' is taken into account in the value of data_out as data_mod=1, and on the second cycle 202d, data_out[21]='1' is ignored as data_mod=0.

In possible embodiments, the PCS circuitry may need to operate on 21 or 22 bits per period on behalf of the data stream that are oversampled by 3 times. However, the IC used to implement the low latency network device 200 may not offer a native/transparent 66 bits or 33 bits internal data width. The ratio of bits/period may not lead to any deficiencies compared to running a parallel interface at a 64 bits or 32 bits interface. Indeed, depending on the implementation, the PCS function only ever needs to wait for as many as 21 extra bits to come across to send out the packet delineated parallelized data 240, so it is superior (i.e. generates less latency) to circuits running at 322 MHz (10.3125/32). In other words, the minimum gap between valid words at 483 MHz is 2.069 nsec whereas the minimum gap for 322 MHz is 3.103 nsec, which provides a nominal boost to low latency operation.

Figure 6:
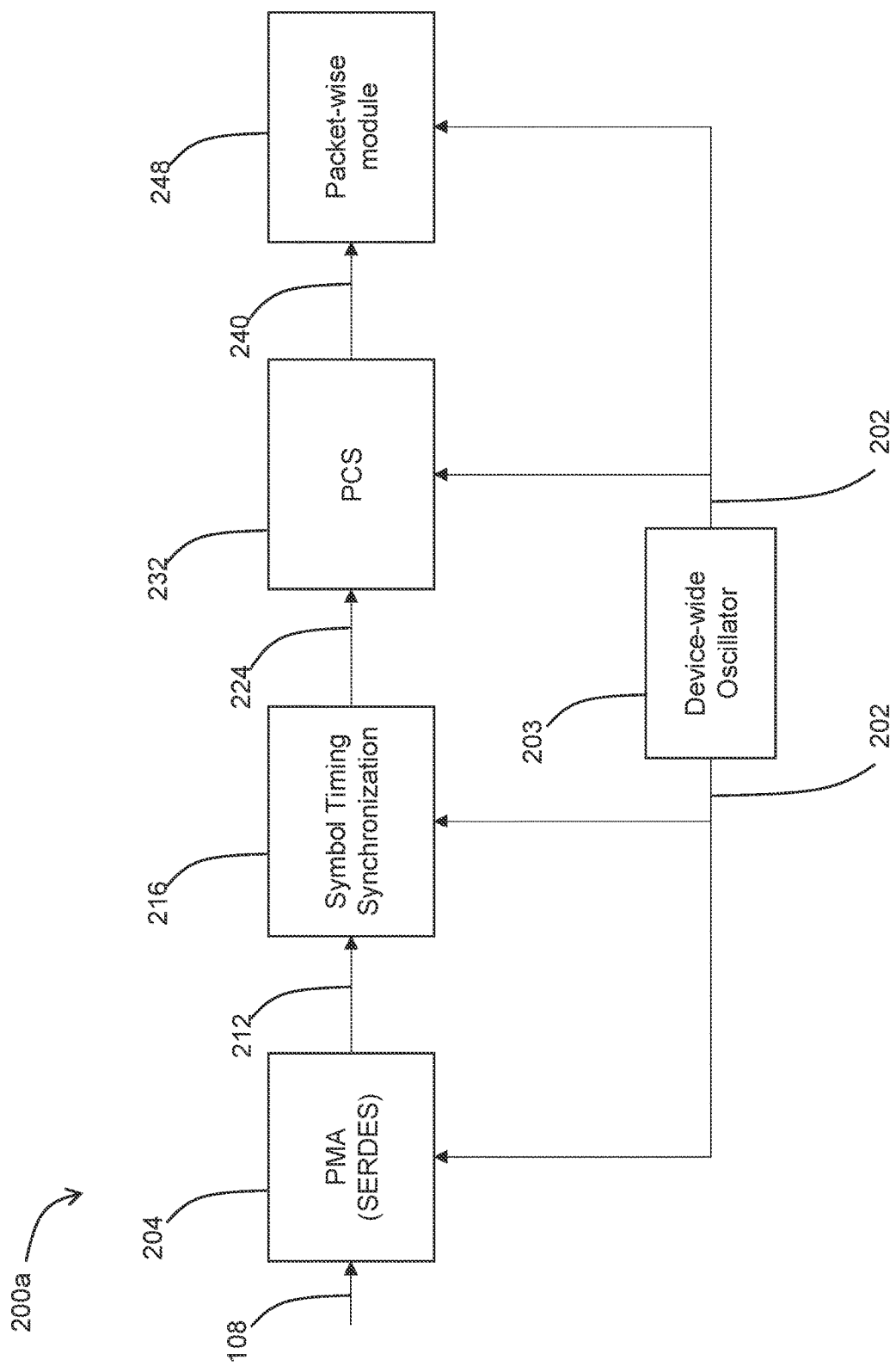
FIG. 6 illustrates a schematic diagram of an exemplary implementation of the low latency network device in which at least one packet-wise module is implemented as part of the network device.

Referring now to FIG. 6, therein illustrated is a schematic diagram of an exemplary implementation of the improved low latency network device 200a in which at least one packet-wise module 248 is implemented as part of the network device 200. As described elsewhere herein, the packet-wise module 248 receives the packet-delineated parallelized data 240 already timed to the device-wide clock 202. It will be appreciated that the data is passed from the PMA module 204 to the packet-wise module 248 free of (i.e. without) a clock-domain crossing operation over the data path. Accordingly, the packet-wise module 240 carries out operations on the packet-delineated parallelized data 240 while being driven by the device-wide clock 202. Notably, both the PMA module 204 and the packet-wise module 248 are driven by the same clock, being the device-wide clock 202. Moreover, both the PMA module 204 and the packet-wise module 248 are directly driven by the device-wide clock 202 at the same phase of the device wide clock 202, i.e. free of a phase adjustment, such as a phase lock loop, being applied to the device wide clock 202 when driving either of the modules.

Figure 7:
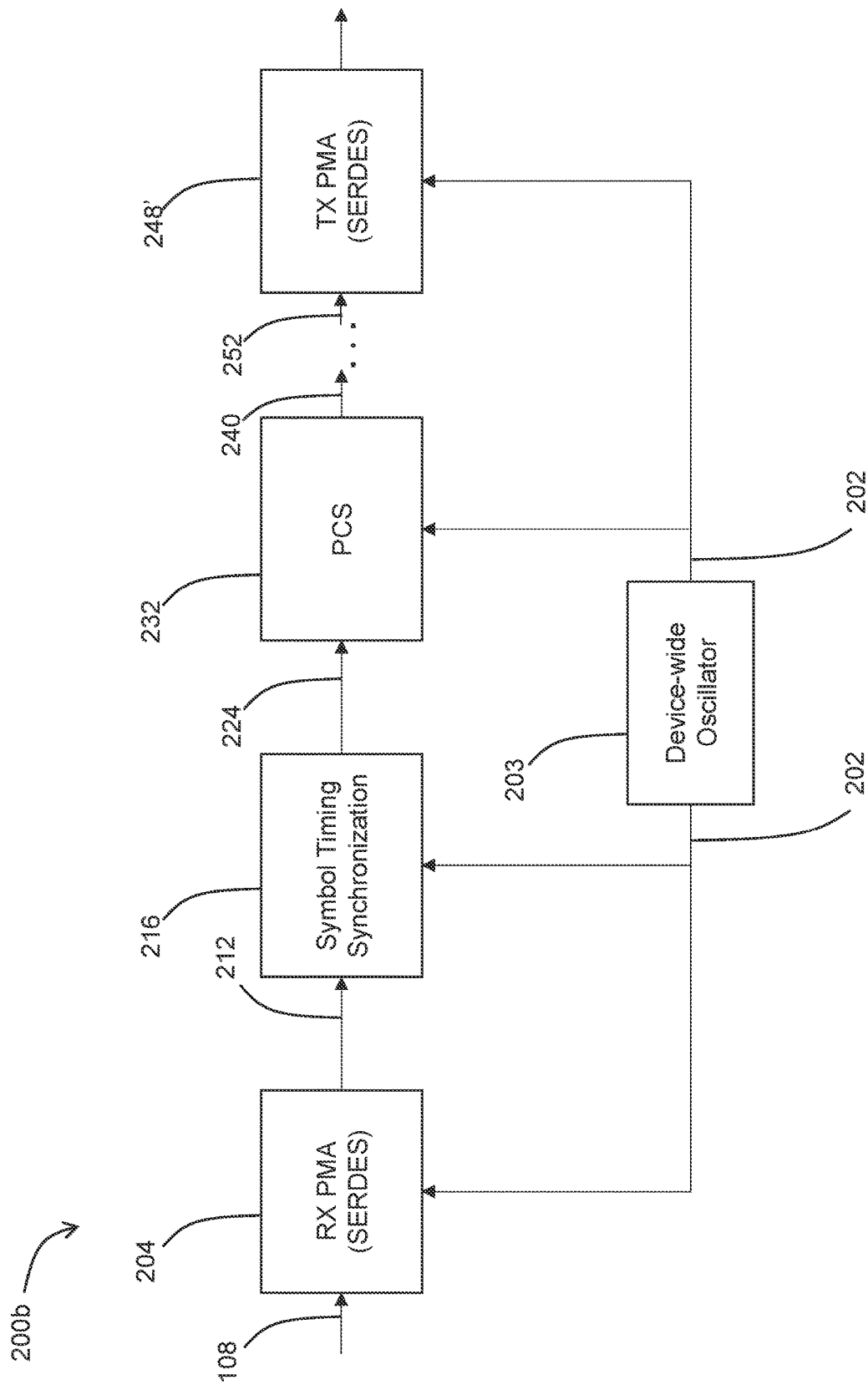
FIG. 7 illustrates a schematic diagram of an exemplary implementation of the low latency network device in which the at least one packet-wise module operates to transmit data as part of switching the received serial data.

Referring now to FIG. 7, therein illustrated is a schematic diagram of an exemplary implementation of the improved low latency network device 200b in which the at least one packet-wise module operates to transmit data as part of switching the received serial data 108. As described elsewhere herein, the packet-wise module includes a transmitting PMA module 248'. The packet-delineated parallelized data 240 is treated, such as by a transmitting-side PCS (not shown) to generate transmitting data samples 252 that are to be transmitted. The transmitting PMA module 248' carries out the serializing of the transmitting data samples 252 while being driven by the device-wide clock 202. Notably, both the receiving PMA module 204 and the transmitting PMA module 248' are driven by the same device-wide clock 202. Moreover, both the receiving PMA module 204 and the transmitting PMA module 248' are directly driven by the device-wide clock 202 at the same phase of the device-wide clock 202 (i.e. free of a phase adjustment, such as a phase lock loop, being applied to the device wide clock 202 when driving either of the PMA module 204 and the transmitting PMA module 248'). It was further observed that the use of the device-wide clock 202 to drive the transmitting PMA module 248' also applies an oversampling of the transmitting data samples. This oversampling at the transmitting PMA module 248' also reduces the latency within the transmitting PMA module 248', thereby also providing latency reduction of the improved low latency network device 200b when implemented for switching.

It will be appreciated that operations on the received serial data 108 are immediately carried out according to the timing of the device-wide clock 202 as soon as the serial data 108 is received. In particular, the oversampling of the received serial data 108 within the PMA module 204 is immediately carried out according to the timing of the device-wide clock 202. Furthermore, all subsequent operations on the received data are also carried out according to the timing of the device-wide clock 202. Since the same timing provided by the device-wide clock 202 is used, the network device 200 can also implement multiple data paths in parallel while having the same timing for all of the signal paths.

Figure 8:
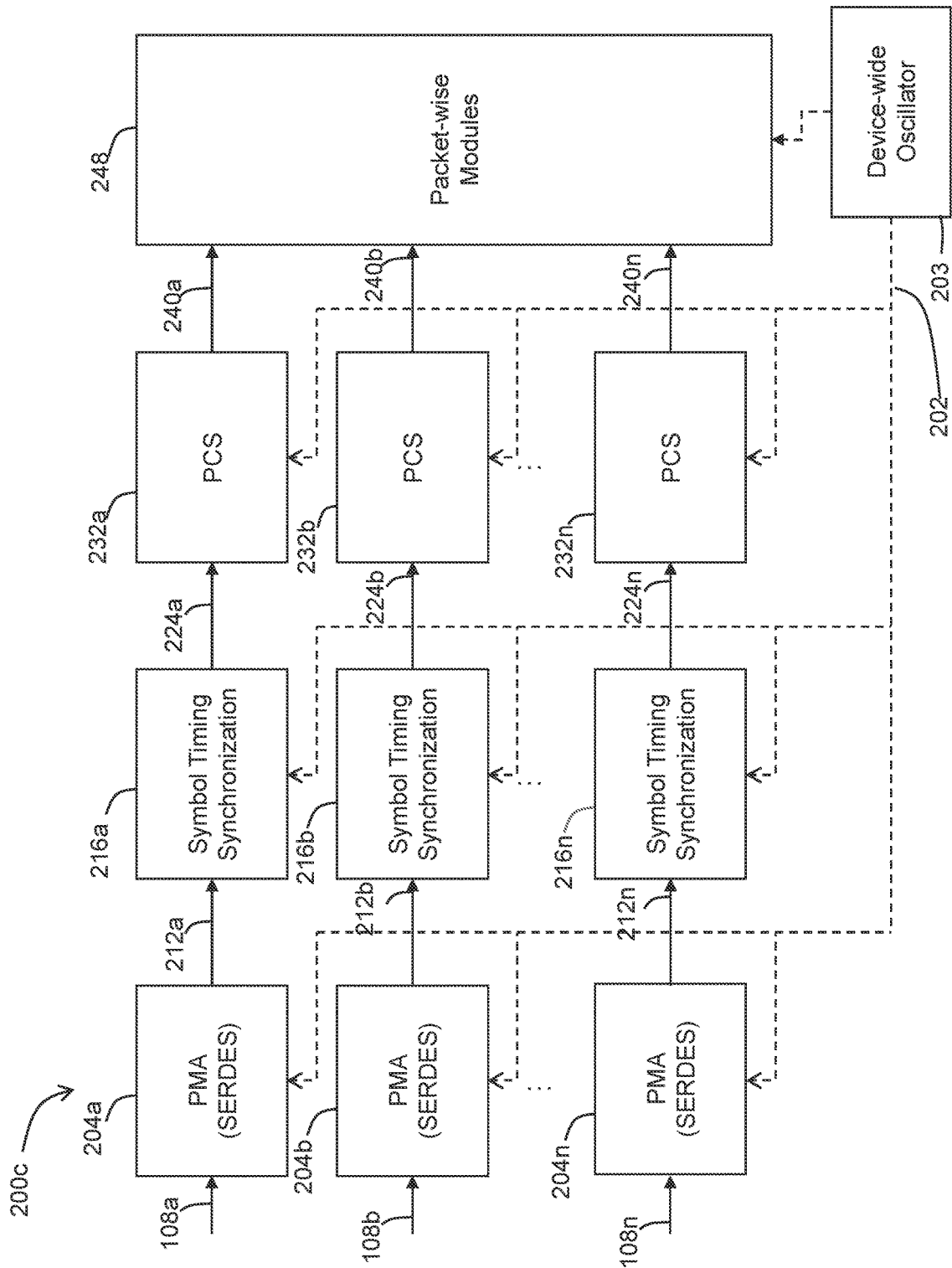
FIG. 8 illustrates a schematic diagram of an exemplary implementation of the low latency network device in which multiple parallel data streams are treated while having the same timing.

Referring now to FIG. 8, therein illustrated is a schematic diagram of an exemplary implementation of the improved low latency network device 200c in which multiple parallel data paths are treated in parallel while having the same timing. As illustrated in FIG. 8, the low latency network device 200c receives a plurality of serial data streams 108a, 108b, up to 108n. The network device further comprises a plurality of receiving PMAs 204a, 240b, up to 204n that are each configured to deserialize a respective one of the plurality of received serial data streams 108a . . . 108n to output a respective parallelized sample stream 212a, 202b . . . 212n. Each of the receiving PMAs are driven by the same device-wide clock 202, such that each of the data paths corresponding to the received serial data streams 108a . . . 108n have the same timing. As further illustrated, for each receiving PMA 204a . . . 204n, the low latency network device 200c further includes a respective symbol timing synchronization module 216a, 216b . . . 216n to detect, from its parallelized sample stream 212a, 212b . . . 212n, a respective synchronized bit value stream 224a, 224b . . . 224n. Furthermore, the low latency network device 200c also includes, for each symbol timing synchronization module 216a, 216b . . . 216n, a respective PCS module 232a, 232b . . . 232n to perform packet delineation on its synchronized bit value stream 224a, 224b . . . 224n to provide a respective packet-delineated parallelized data streams 240a, 240b . . . 240n. The multiple packet-delineated parallelized data 240a, 130b . . . 240n are provided to a plurality of packet-wise modules 248 that perform operations on the multiple packet-delineated parallelized data stream. The plurality of packet-wise modules 248 are also driven by the device-wide clock 202.

It was further observed that the PMA module 204 being driven directly by the device-wide clock 202 free of a phase adjustment or phase lock loop being applied thereto and free of any subsequent clock-domain crossing allows for assigning timing information to each data bit/symbol of the received serial data 108 with significantly higher accuracy. Since the received serial data 108 is immediately and directly oversampled according to the timing of the device-wide clock 202, the timing information of the data bits/symbols can be accurately defined according to the timing of the device-wide clock 202. That is, each data/symbol can be time-stamped in accordance to the timing of the device-wide clock 202.

Figure 9:
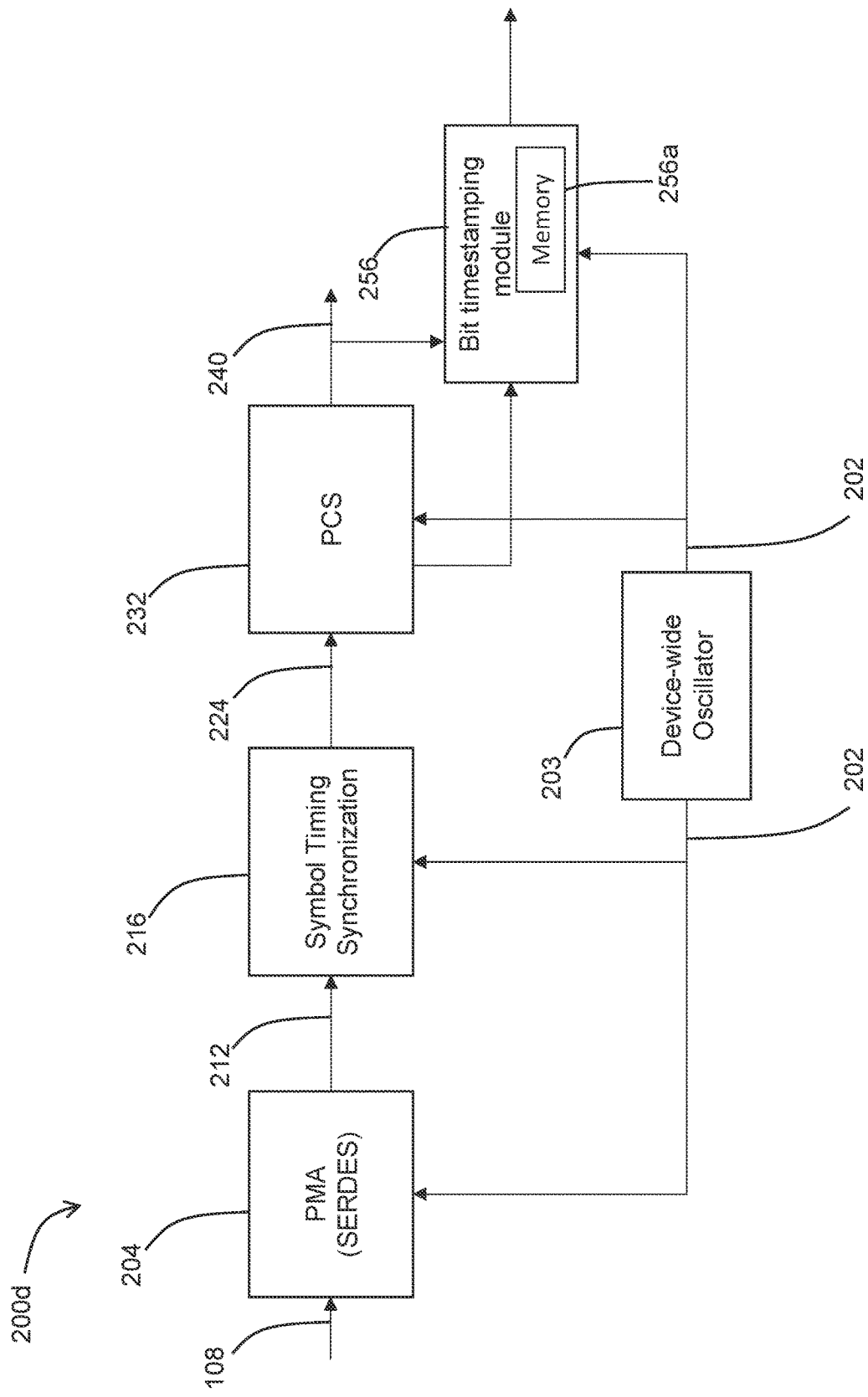
FIG. 9 illustrates a schematic diagram of an exemplary implementation of the low latency network device having time stamping functionalities.

Referring now to FIG. 9, therein illustrated is a schematic diagram of an exemplary implementation of the improved low latency network device 200d having time-stamping functionalities according to one example embodiment. It will be understood that the time-stamping functionalities can be included in any of the exemplary implementations of the low latency network device described herein, such as with reference to FIGS. 2, 5, 6 and 7. The improved low latency network device 200d includes a bit timestamping module 256 that receives the synchronized bit values 224 from the symbol timing synchronization module 216. The bit time stamping module 256 also receives the packet-delineated data 240, or at least the position of the header bit of each packet (ex: 66b sync header in a 66b PCS code) as determined by the PCS module 232. The bit timestamping module 256 is also driven by the device-wide clock 202 such that it has the same timing as the other modules of the network device 200d. The bit timestamping module 256 can assign, based on the position of each bit of the synchronized bit values 224 and the timing from the device-wide clock 202, a bit-wise time stamp for each individual bit of the synchronized bit values 224. Such bit-wise time stamp can be stored in a memory 256a accessible from the bit time stamping module 256. In particular, the bit timestamping module 256 can assign, based on the position of the header bit of each packet and the timing from the device-wide clock 202, a bit-wise time stamp for the header bit, which further provides the time stamp for that packet.

The timestamp value assigned to a given bit of the synchronize bit value 224 is determined based on the point in time, as defined by the timing from the device-wide clock 202, at which a given word of the synchronized bit values 224 is outputted from the symbol timing synchronization module 216 and received at the timestamping module 256. The timestamp value is further determining by adding, to the time point of the given word of the synchronized bit values 224, the position of the given bit within the synchronized bit value 224 multiplied by an appropriate temporal bit width. The position of the given synchronized bit value can be defined according to the position of its corresponding sample within each word of the parallelized sample stream 212. In this case, the appropriate temporal bit width is defined as the unit interval of each sample of the parallelized sample stream 212 (which is a function of the speed of the device-wide clock 202 and the selected internal data width).

It is expected that the timestamp values determined by the timestamping module 256 will be off the time-critical (i.e. low-latency) data path. For example, the timestamp values can be used at a later, non-critical, moment for data verification or analysis (ex: for verifying the timing of one packet in high-frequency trading versus the timing of another packet). While time-critical propagation of the timestamp values can be achieved, it is expected that the effort for doing so will likely increase latency.

Referring back to FIG. 3, the representation of three 64-bit/sample words of the example parallelized sample stream 212 further illustrates the timestamping of a particular sample, which sample will also correspond to a bit within the synchronize bit values 224. Supposing that the device-wide clock 202 has a speed of 483.398 MHz, the unit interval is 32.32 ps (=16/495 ns). Accordingly, each word has an interval of 64*(16/495) ns=2 34/495 ns. Supposing that the sync header bits for a given packet are located in data bit/symbols "d22" 258 and "d23" 260 of the second word 264. Relative to beginning of the first word 262, which is defined as t=t0, the time point of the second word 264 therefore is received at t=t0+2 34/495 ns. The symbol timing synchronization module 216 would select the second sample of "d22" (sample 266) as the center sample for the corresponding data bit value/symbol of the received serial data 108, and the value of this sample 266 also becomes the corresponding bit value of the synchronized bit values 224. The sample 266 is located at fourth position within the word 264 and its timing 268 is 3 unit intervals from the beginning of the word 264. Therefore, the timing of sample 266, which also defines the beginning of the detected packet, is determined by adding 3 times the unit interval to the timing of word 264 (3*16/495+234/495 ns).

Each timestamp value has an accuracy (i.e. uncertainty) of the unit interval plus about half of a duration of the data bit/symbol of the received serial data 108 (i.e. about half of a symbol time). It was observed that the use of the same device-wide clock 202 to drive the components of the network device 200, so that the device can be free of a clock domain crossing, allows the timestamp value to be orders of magnitude more accurate. By contrast, any timestamping of bit values of the resynced packet-delineated data 140 according to the local clock within a network device having clock domain crossing (ex: the prior art network device 100) would necessarily be subject to the timing uncertainty introduced by the crossing from the external clock domain to the local clock domain. Since the clock domain crossing requires at least one or two cycles, the timing uncertainty of any timestamping of the resynced packet-delineated data 140 is also in the order of magnitude of the duration of clock cycles.

Figure 10:
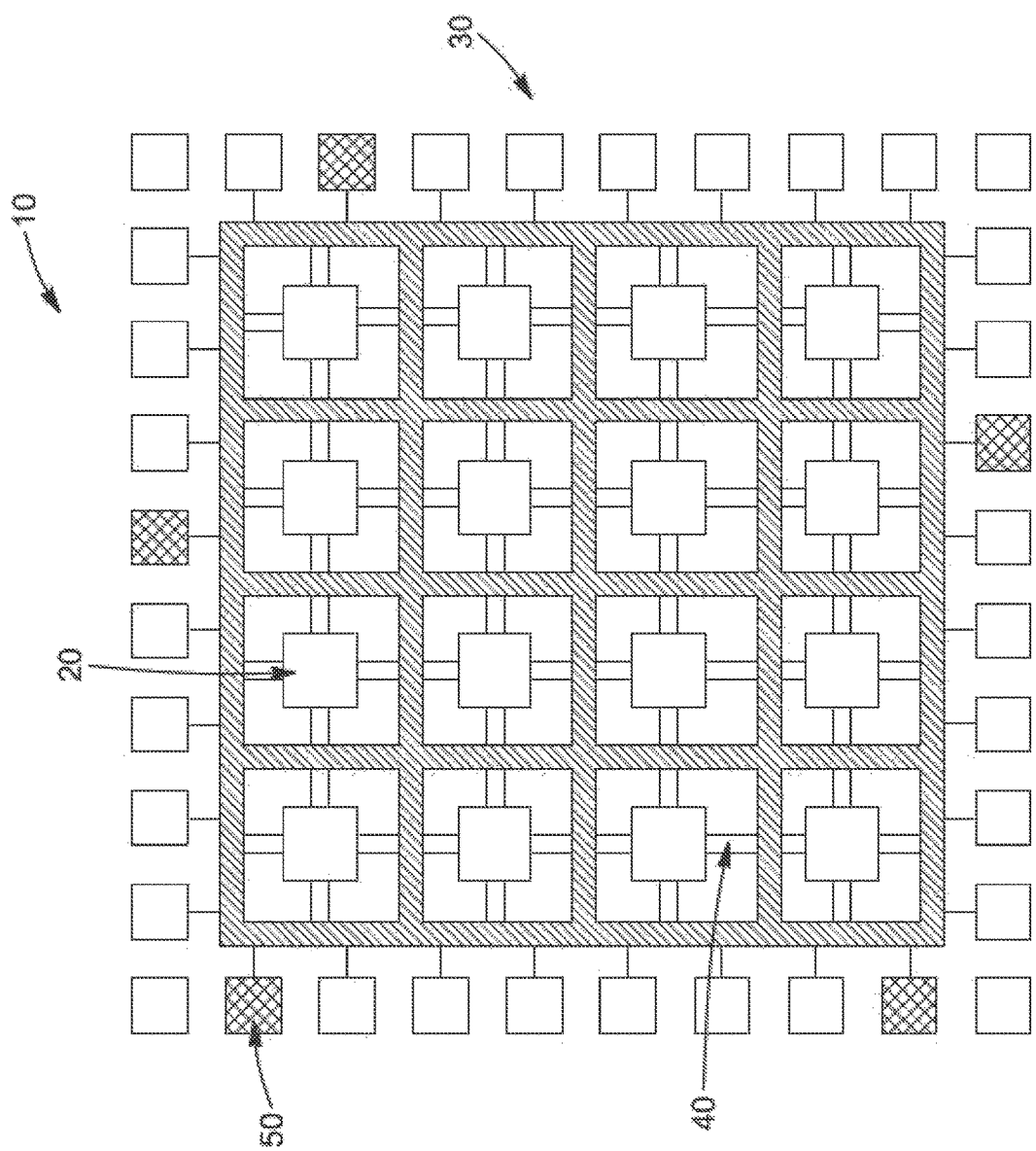
FIG. 10 illustrates a field-programmable gate array (FPGA) which can be used to implement the network device, according to possible embodiments.

Referring to FIG. 10, an exemplary implementation of a network device 200 of FIGS. 2 to 8, built with an FPGA, is represented. The FPGA 10 includes a large number of different programmable tiles 20, input/output blocks (IOBs) 30, IOBs with special functionalities (special IOBs) 50, and programmable interconnects elements 40.

Figure 10B:
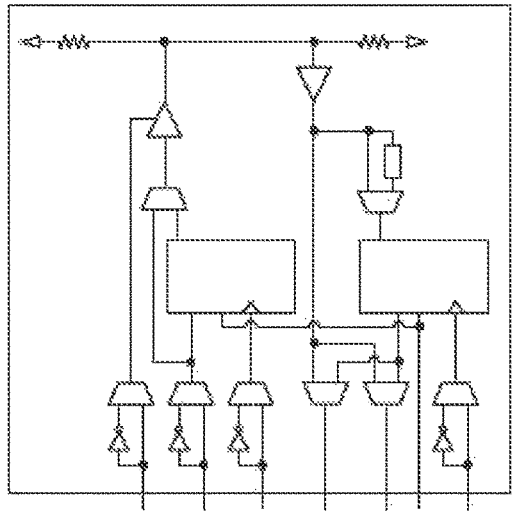
FIGS. 10A, 10B, 10C and 10D illustrate a configurable logic block, an input/output block, programmable interconnects elements, and a PMA, respectively.
Figure 10C:
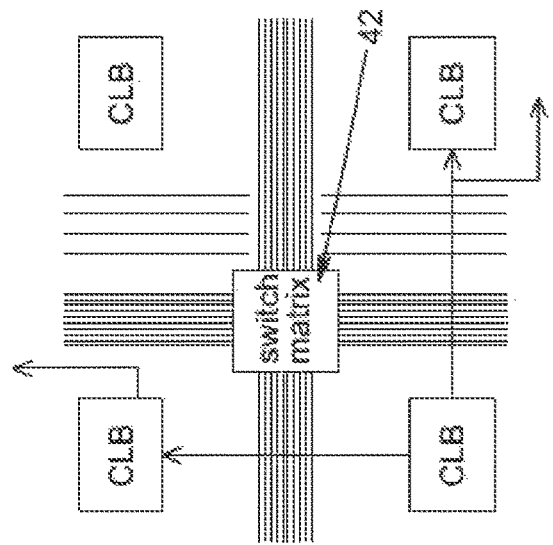
Figure 10A:
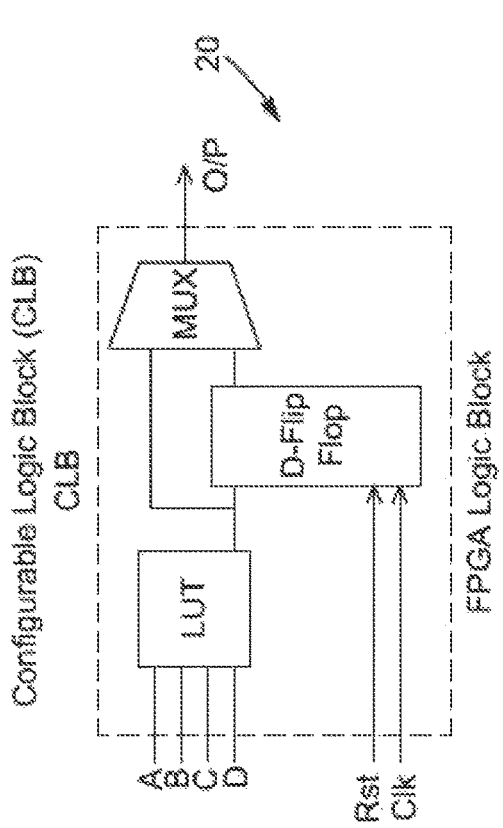

The tiles 20 can include, but are not limited to, configurable logic blocks (CLBs), memory, controllers, processors, digital clocks, PLLs and/or serializers and deserializers. FIG. 10a illustrates an example of a CLB, including transistors and/or look-up tables (LUTs), multiplexers and flip-flops.

An input/output block (IOBs) 30 is a programmable input and output unit, which is the interface between the FPGA and external circuits, which may perform additional operations on the data treated at the receiving end of the device 200. An IOB is used to complete the driving and matching requirements for input/output signals under different electrical characteristics. FIG. 10B illustrates an example of circuit of an 10B.

Figure 10D:
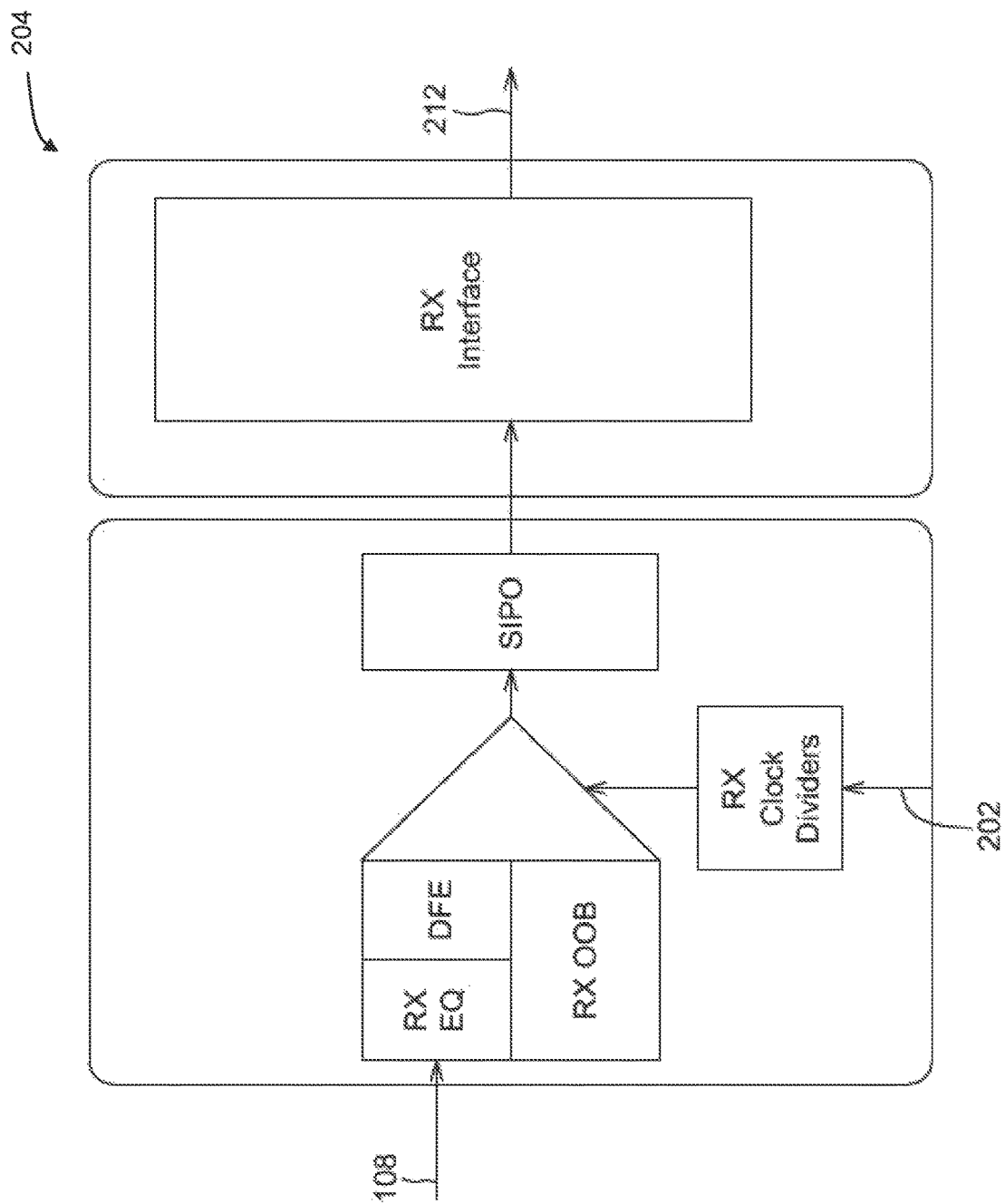

Some of these IOBs may have special functionalities. For example, the PMA is implemented in one of these special IOBs 50. FIG. 10D illustrates an example of circuit of a special IOB 50, such as a PMA. In the embodiment described, the PMA 204 is operating as a receiver (RX). The PMA receives serial data 108 via a RX equalizer (RX EQ) and a Decision Feedback Equalizer (DFE). Combined with a Rx Out-of-band signaling (RX OOB), the signal is therefore transmitted to a Serial Input Parallel Output (SIPO), also called SERDES, driven by a RX Clock Dividers. The RX Clock Dividers receive the device-wide clock 202 generated locally by the oscillator 203 and configure the PMA module 204 to have the given internal data width. Then when exiting the SIPO/SERDES, the parallelized sample stream 212 is transmitted outside the PMA through a RX Interface. The RX Interface is a gateway to the parallelized sample stream and configure the parallelized sample stream to the appropriate predetermined data width. In the embodiment shown, the selected data width is 64 bits, but other data widths (16, 20, 32, 40, 80, 128 or 160 bits) can be selected. The programmable interconnects elements 40 provide direction and connections between the tiles to implement the network device. FIG. 10C illustrates a switch matrix 42 that provides switching between interconnects.

The tiles 20 and the IOBs 30 can be interconnected using the programmable interconnect elements 40. Information for programming the tiles 20, for setting parameters of the IOBs 30, and for programming the programmable interconnect elements 40 is stored in a configuration memory (not shown).

Figure 11:
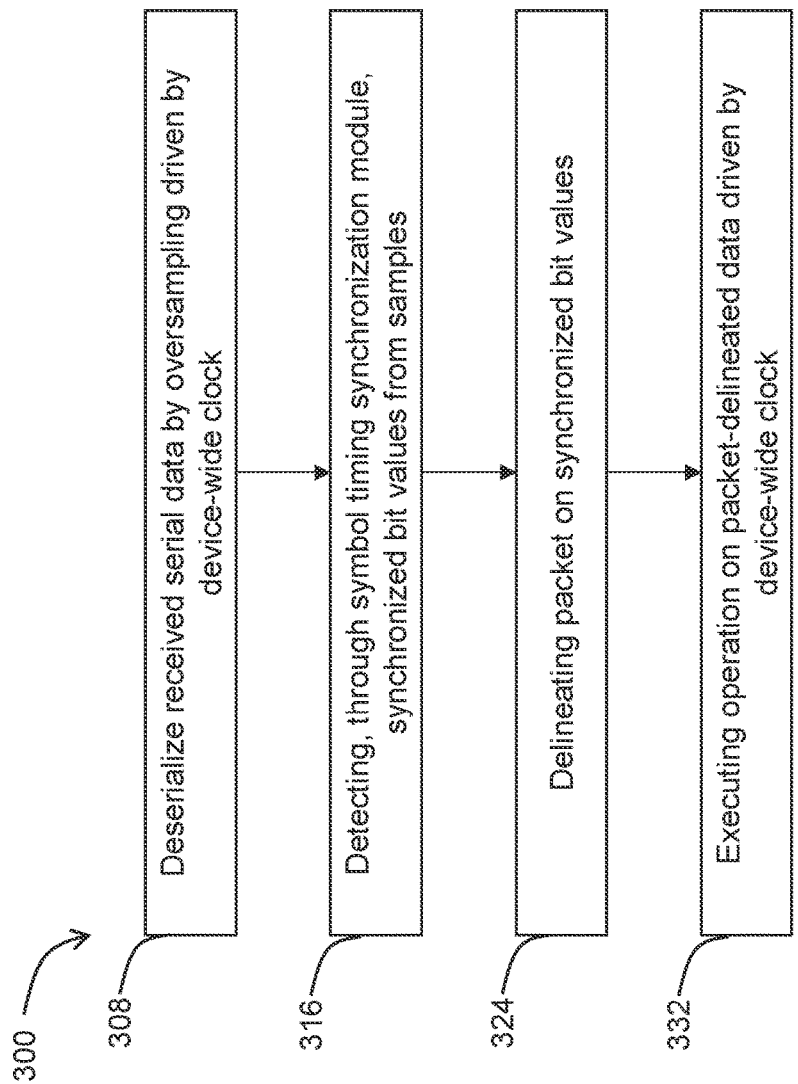
FIG. 11 illustrates a flowchart showing the operational steps of a method for low latency treatment of serial data received by a network device, according to one example embodiment.

Referring now to FIG. 11, therein illustrated is a flowchart showing the operational steps of a method 300 for low latency receiving of serial data received at a receiving data rate according to one example embodiment. The method 300 can be carried out at the improved low-latency network device described herein according to various exemplary embodiments.

At step 308, the received serial data is deserialized by oversampling driven by a device-wide clock and according to an appropriate word-width for the deserialization. The deserializing outputs a parallelized sample stream that is an oversampling of the received serial data. Furthermore, the oversampling of the received serial data is asynchronous. The deserialization can be carried out at the receiving PMA module 204 of the improved low latency network device 200 described herein according to various example embodiments.

At step 316, the received symbol timing synchronization is performed to detect, from the parallelized sample stream, synchronized bit values corresponding to bit values/symbol values of the received serial data 108. Step 316 can be carried out at the symbol timing synchronization module 216 of the improved low-latency network device 200 described herein according to various example embodiments.

At step 324, packet delineation is performed on the synchronized bit values to provide packet-delineated parallelized data. Step 324 can be performed at the PCS module 232 of the improved low-latency network device 200 described herein according to various example embodiments.

At step 332, at least one operation is performed on the packet-delineated parallelized data while being driven by the device-wide clock. Step 332 can be performed at the packet-wise module 248 of the improved low latency network device described herein according to various example embodiments and/or at a device or component that is external to the network device.

According to various example embodiments, the improved low latency network device 200 can be implemented on a commercially available programmable device. For example, the programmable device can be a field-programmable gate array (FPGA) with a programmable transceiver. Accordingly, various modules of the network device 200 can be implemented using components already available on the programmable device with appropriate configuration.

According to some example embodiments, the PMA module 204 can be implemented using a PMA available on the programmable device, while disabling the clock data recovery of the available PMA and driving by the PMA using the internal clock of the programmable device.

Furthermore, the combination of the internal data width of the available PMA and the speed of the internal clock so that the received serial data 108 is oversampled by an appropriate oversampling factor, as described elsewhere herein. According to one example embodiment, the internal clock of the programmable device is set at up to a maximum operable frequency of the internal clock. It will be understood that running the internal clock up to its maximum operable frequency also increases the clock/data rate for other components within the network device 200 driven by the internal clock (ex: the symbol timing synchronization module 216, PCS module 232, and packet-wise modules 248), which also contributes to a reduction in latency along the data path. In particular, it was observed that increasing the speed of the internal clock can substantially lower latency in the serializer of the transmitting PMA 248'.

Various components of the lower latency network device 200 can be implemented within a programmable fabric of the FPGA. In particular, the symbol timing synchronization 216 can be implemented on the fabric of the FPGA. Accordingly, the phase lock loop implemented within the symbol timing synchronization module 216 is a digital phase lock loop. One or more packet-wise modules, such as for processing the packet-delineated parallelized data 240, can also be implemented on the fabric of the FPGA.

According to one example embodiment, the programmable device is a programmable GTY transceiver, such as one commercialized by Xilinx™. For received serial data 108 having 66b encoding and a received serial data of 10.3125 Gb/s, the internal data width is set to 64-bit and the internal clock is set at 483.398 MHz. This combination provides a sampling rate of 30.9375 Gb/s, thereby providing 3× oversampling and an average of 21 1/3 data bit values/symbols per clock cycle. This frequency represents the maximum operable frequency of the internal clock for currently available transceivers (such transceivers typically have a frequency limit of about 515 MHz, while a higher frequency, such as 644.531 MHz is possible, it is only supported on specially screened transceivers). Table 1 illustrates the unit intervals, oversampling factor, and the total latency in unit intervals for a packet switching operation.

| TX LATENCY: | 16-bit | 32-bit | 64-bit |
| --- | --- | --- | --- |
| 1× - 10.3125 Gb/s | 644.531 MHz * | 322.266 MHz | 161.133 MHz |
| UI = 96.97 psec | 75 UI = 7.273 nsec | 141 UI = 13.673 nsec | 253 UI = 24.533 nsec |
| 2× - 20.625 Gb/s | 1.289 GHz - N/A | 644.531 MHz * | 322.266 MHz |
| UI = 48.48 psec | | 141 UI = 6.836 nsec | 253 UI = 12.267 nsec |
| 3× - 30.9375 Gb/s | 1.934 GHz - N/A | 966.8 MHz - N/A | 483.398 MHz |
| UI = 32.32 psec | | | 253 UI = 8.178 nsec |

Source: {"https://www.xilinx.com/support/answers/69011.html"}

It was also observed that the PCS module must operate on 21 to 22 data bits/symbols per clock cycle when operating at 3X oversampling with the 64-bit/sample internal data width. However, since the SERDES on the Xilinx™ transceiver does not offer a native/transparent 66b or 33b width, operating at the 64-bit/sample internal data width does not lead to any deficiencies compared to running the parallel interface at 32-bit/sample width. The PCS module only needs to wait for as many as 21 extra data bits/symbols to come across to complete its next packet delineation. Therefore, running at 64 bit/sample width and at 483.398 MHz is superior (latency wise) than running at 322 MHz (10.312 Gbs and 32-bit/sample). In other words, the minimum gap between valid words at 483.398 MHz is 2.069 ns, whereas the minimum gap at 322 MHz is 3.013 ns, which further provides a decrease in latency.

According to various other example embodiments, a portion of the improved low-latency network device 200 can be implemented as a custom solution, such as an application specific integrated circuit (ASIC), in combination with FPGA-implemented components. In other embodiments, the low-latency network device 200 can be wholly implemented as a custom solution.

Various exemplary embodiments described so far herein are generally applicable to receiving binary serialized data, such as data with non-return to zero (NRZ) encoding. It should be understood that the exemplary embodiments are also applicable to serialized data transmitted using multi-level encoding/modulation, such as PAM4. Currently the latency of PAM-4 transceivers is typically higher than NRZ due to the additional complexity in the analog front end, the equalizer, clock and data recovery circuit, and data slicer. However, the ability to detect symbols with an additional quantization bit significantly increases the fidelity of recovering and tracking symbol timing of the incoming data pattern. It is also possible to relax the requirement of having an oversampling factor that is an integer number. Accordingly, the oversampling factor for such implementations can be substantially lower than the oversampling factor for binary encoded data. The oversampling factor for such multi-level encoded data can be 1.3x or higher could potentially provide adequate timing and data recovery. Furthermore, in a switching application, since the receiving PMA and the transmitting PMA are driven by the same device-wide clock, the transmitter can be run at a non-integer oversampling rate, with better control of signal levels for performing zero-crossings. This would enable better control over the selection of the frequency of the device-wide cock which may further enable other applications to operate at the frequency of the device-wide clock and lead to power and area reduction.

While various examples have been provided herein for received serial data having 10Gb data rate, 10.3125 Gb/s, it will be understood that methods and devices described here are also applicable to other data rates, such as 1.25 Gb/s, 9.953 Gb/s, 2.5 G/XAUI with appropriate adaptations, or fiber channels (ex: at 1.0625 Gb/s, 2.125 Gb/s, 4.25 Gb/s, 8.5 Gb/s, or 14.025 Gb/s). It is expected that the methods and devices will also be applicable for oversampling of 25G Ethernet by a 100 GSa/s receiver.

Furthermore, while the timestamping described herein is most applicable to applications such as high-frequency trading, it is expected that the improved accuracy of the timestamping may also make it useful for interfaces like eCPRI or Ethernet with PTP 1588 timing and other applications for cellular networks.

While the above description provides examples of the embodiments, it will be appreciated that some features and/or functions of the described embodiments are susceptible to modification without departing from the spirit and principles of operation of the described embodiments. Accordingly, what has been described above has been intended to be illustrative and non-limiting and it will be understood by persons skilled in the art that other variants and modifications may be made without departing from the scope of the invention as defined in the claims appended hereto.

The invention claimed is:

1. A low-latency network device for treating serial data received at a receiving data rate, the device comprising:
   an oscillator generating a device-wide clock;
   a receiving physical medium attachment (PMA) having an internal data width, the PMA being configured to:
      receive the serial data,
      deserialize the serial data based on the device-wide clock and internal data width, whereby the received serial data is oversampled, the oversampling of the received serial data being asynchronous relative to a timing of the received serial data, and
      output a parallelized sample stream;
   a symbol timing synchronization module configured to:
      receive the parallelized sample stream; and
      detect, from the parallelized sample stream, synchronized bit values corresponding to bit values of the received serial data; and
   a physical convergence sublayer (PCS) configured to:
      receive the synchronized bit values; and
      delineate packets from the synchronized bit values, to provide packet-delineated parallelized data,
   the receiving PMA, the symbol timing synchronization module and the PCS being all driven by the device-wide clock.

2. The network device of claim 1, further comprising at least one packet-wise module configured to receive the packet-delineated parallelized data and to perform on the packet-delineated parallelized data at least one of: processing the packet-delineated parallelized data; logging the packet-delineated parallelized data; converting the packet-delineated parallelized data to a different medium; and broadcasting the packet-delineated parallelized data; wherein the at least one packet-wise module is driven by the device-wide clock.

3. The network device of claim 2, wherein the at least one packet-wise module comprises a transmitting physical medium attachment (PMA) configured to serialize a transmitting data stream generated from the packet-delineated parallelized data to output serialized transmitted data, the transmitting PMA being driven by the device-wide clock.

4. The network device of claim 1, wherein the network device receives a plurality of serial data streams each comprising serial data; and
   wherein the network device comprises a plurality of receiving physical medium attachments each configured to deserialize and oversample a respective one of the plurality of serial data streams to output a respective parallelized sample stream, each of the receiving physical medium attachments being driven by the device-wide clock.

5. The network device of claim 1, wherein the receiving PMA has an internal clock and data recovery (CDR) module and wherein the CDR module is disabled.

6. The network device of claim 1, wherein the receiving PMA is driven by the device-wide clock free of a phase adjustment being applied to the device-wide clock.

7. The network device of claim 6, wherein the symbol timing synchronization module implements a digital phase lock loop (PLL) to determine timing information for detecting the synchronized bit values from the parallelized sampled stream.

8. The network device of claim 7, wherein the symbol timing synchronization module tracks, with the digital phase lock loop (PLL), frequency offsets in bit transitions between current and previous word(s) of the parallelized sampled stream.

9. The network device of claim 1, wherein the parallelized sample stream is an oversampling of the received serial data by a factor of at least 2.

10. The network device of claim 1, further comprising:
a bit timestamping module configured to receive the synchronized bit values and to assign a bit-wise time stamp to each individual bit value.

11. The network device of claim 10, wherein the bit timestamping module comprises a timestamp memory to log bit-wise time stamp to each individual bit value.

12. The network device of claim 10, wherein the bit-wise time stamp assigned to each individual bit is assigned based on a time value, according to the device-wide clock, of the deserializing of the received serial data by the receiving PMA, the internal data width, and a position of a sample within the parallelized sampled stream corresponding to the individual bit.

13. A method for processing serial data received at a receiving data rate, the method comprising:
deserializing the received serial data, through a receiving physical medium attachment (PMA), to output a parallelized sample stream, the deserializing being driven by a device-wide clock generated by an oscillator, and according to a word-width of the parallelized sample stream, whereby the parallelized sample stream is an oversampling of the received serial data, the oversampling of the received serial data being asynchronous relative to a timing of the received serial data;
detecting, through a symbol timing synchronization module, from the parallelized sample stream, synchronized bit values corresponding to bit values of the received serial data; and
delineating packet on the synchronized bit values, through a physical convergence sublayer (PCS), to provide packet-delineated parallelized data,
wherein the receiving PMA, the symbol timing synchronization module and the PCS are all driven by the device-wide clock.

14. The method of claim 13, further comprising executing, on the packet-delineated parallelized data, at least one of: processing the packet-delineated parallelized data; logging the packet-delineated parallelized data; converting the packet-delineated parallelized data to a different medium; broadcasting the packet-delineated parallelized data; and serializing a transmitting data stream generated from the packet-delineated parallelized data to output serialized transmitted data;
while being driven by the device-wide clock.

15. The method of claim 13, wherein a plurality of serial data streams are received and wherein the method further comprises:
deserializing each of the plurality of serial data streams to output a respective parallelized sample stream, each of the deserializing being driven by the device-wide dock.

16. The method of claim 15, wherein detecting, through the symbol timing synchronization module, the synchronized bit values from the parallelized sample stream, the symbol timing synchronization module being carried out using a digital phase lock loop to determine timing information for detecting the synchronized bits values from the parallelized sampled stream.

17. The method of claim 16, wherein determining the timing information comprises tracking, with the digital phase lock loop (PLL), frequency offsets in bit transitions between current and previous word(s) of the parallelized sampled stream.

18. The method of claim 13, wherein the parallelized sample stream is an oversampling of the received serial data by a factor of at least 2.

19. The method of claim 13, further comprising assigning a bit-wise time stamp to each individual bit value of the synchronized bit values.

20. The method of claim 19, wherein the bit-wise time stamp assigned to each individual bit is assigned based on a time value, according to the device-wide clock, of the deserializing of the received serial data, the word-width, and a position of a sample within the parallelized sampled stream corresponding to the individual bit.

* * * * *